United States Patent
Asai et al.

(10) Patent No.: US 10,032,622 B2
(45) Date of Patent: Jul. 24, 2018

(54) LIGHT SOURCE DEVICE

(71) Applicant: HAMAMATSU PHOTONICS K.K., Hamamatsu-shi, Shizuoka (JP)

(72) Inventors: Akinori Asai, Hamamatsu (JP); Kenshi Fukumitsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/712,284

(22) Filed: Sep. 22, 2017

(65) Prior Publication Data

US 2018/0012750 A1    Jan. 11, 2018

Related U.S. Application Data

(63) Continuation of application No. 15/478,306, filed on Apr. 4, 2017, now Pat. No. 9,824,879, which is a (Continued)

(30) Foreign Application Priority Data

| Dec. 6, 2013 | (JP) | 2013-253262 |
| Dec. 6, 2013 | (JP) | 2013-253264 |
| Apr. 10, 2014 | (JP) | 2014-081350 |

(51) Int. Cl.
  H01J 65/04      (2006.01)
  H01J 61/073     (2006.01)
  G03F 7/20       (2006.01)

(52) U.S. Cl.
  CPC .......... *H01J 65/04* (2013.01); *G03F 7/70025* (2013.01); *H01J 61/0737* (2013.01)

(58) Field of Classification Search
  CPC ........ H01J 65/04; H01J 61/0737; H01J 40/06; G03F 7/70; G03F 7/70008;
  (Continued)

(56) References Cited

U.S. PATENT DOCUMENTS

| 4,152,625 A | 5/1979 | Conrad |
| 7,786,455 B2 * | 8/2010 | Smith .................... B82Y 10/00 |
| | | 250/493.1 |

(Continued)

FOREIGN PATENT DOCUMENTS

| FR | 2554302 A1 | 5/1985 |
| JP | H04-144053 A | 5/1992 |

(Continued)

OTHER PUBLICATIONS

C. Carlhoff et al., "Continuous Optical Discharges at Very High Pressure," Physica, 439-447, vol. 103C, North-Holland Publishing Company.

(Continued)

*Primary Examiner* — Joseph L Williams
*Assistant Examiner* — Jose M Diaz
(74) *Attorney, Agent, or Firm* — Drinker Biddle & Reath LLP

(57) ABSTRACT

In a light source device, a control unit causes an energy density of a laser light in a lighting start region RS when a laser support light is maintained to be lower than an energy density of the laser light in the lighting start region RS when the laser support light is put on. For this reason, when the laser support light is maintained, a laser light L is radiated to the lighting start region RS at an energy density of a degree where sputtering does not occur. Therefore, in the light source device, because sputtering in a light emission sealing body can be suppressed, a sufficiently long life can be realized.

24 Claims, 33 Drawing Sheets

Related U.S. Application Data continuation of application No. 15/022,222, filed as application No. PCT/JP2014/080345 on Nov. 17, 2014, now Pat. No. 9,646,816.

(58) Field of Classification Search
CPC ............. G03F 7/70016; G03F 7/70025; G03F 7/70033; G03F 7/70041
See application file for complete search history.

(56) References Cited

U.S. PATENT DOCUMENTS

| | | | |
|---|---|---|---|
| 8,182,127 B2 | 5/2012 | Yasuda et al. | |
| 8,242,695 B2 * | 8/2012 | Sumitomo | H01J 61/025 250/504 R |
| 8,259,771 B1 | 9/2012 | Shchemelinin et al. | |
| 9,506,871 B1 * | 11/2016 | Flock | G01N 21/8806 |
| 9,814,126 B2 * | 11/2017 | Van Heumen | H05H 1/24 |
| 2007/0228288 A1 | 10/2007 | Smith | |
| 2010/0264820 A1 | 10/2010 | Sumitomo et al. | |
| 2011/0026547 A1 | 2/2011 | Yokota | |
| 2011/0181191 A1 | 7/2011 | Smith et al. | |
| 2014/0291546 A1 | 10/2014 | Bezel et al. | |
| 2014/0367592 A1 | 12/2014 | Bezel et al. | |
| 2015/0034838 A1 | 2/2015 | Bezel et al. | |
| 2015/0048741 A1 | 2/2015 | Shortt et al. | |
| 2015/0332908 A1 | 11/2015 | Blondia | |
| 2016/0044774 A1 | 2/2016 | Antsiferov et al. | |
| 2016/0268120 A1 | 9/2016 | Bezel et al. | |
| 2016/0336167 A1 | 11/2016 | Blondia | |

FOREIGN PATENT DOCUMENTS

| | | |
|---|---|---|
| JP | 2009-532829 A | 9/2009 |
| JP | 2010-205577 | 9/2010 |
| JP | 2011-035039 A | 2/2011 |
| JP | 2011-049513 A | 3/2011 |
| JP | 2012-518252 A | 8/2012 |
| JP | 2013-045537 A | 3/2013 |

OTHER PUBLICATIONS

Leon J. Radziemski et al., "Laser-Induced Plasmas and Applications," Marcel Dekker, New York, 1989, pp. 169-206.
English-language translation of International Preliminary Report on Patentability (IPRP) dated Jun. 16, 2016 that issued in WO Patent Application No. PCT/JP2014/080345.

* cited by examiner

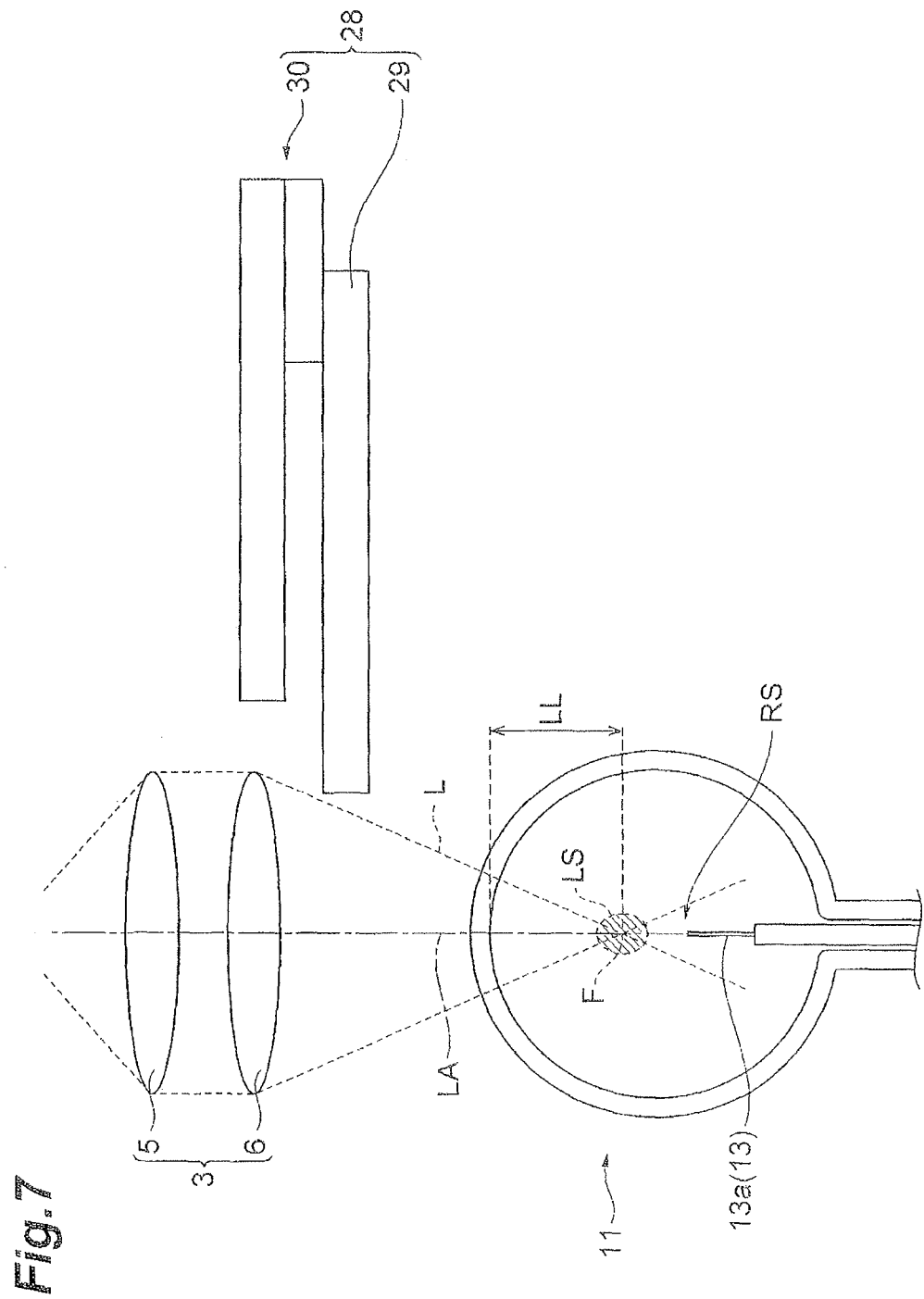

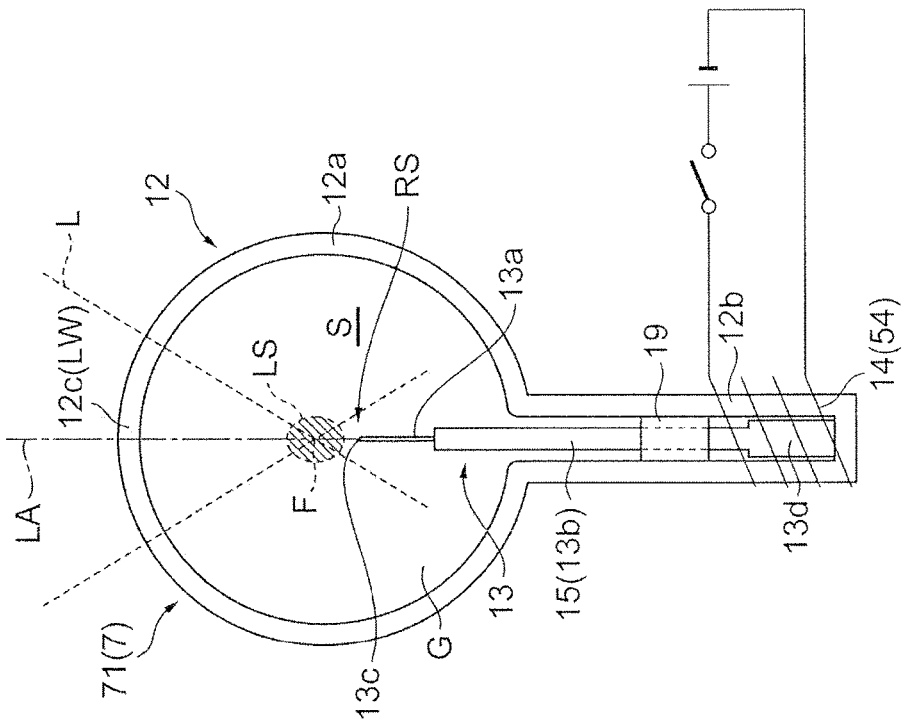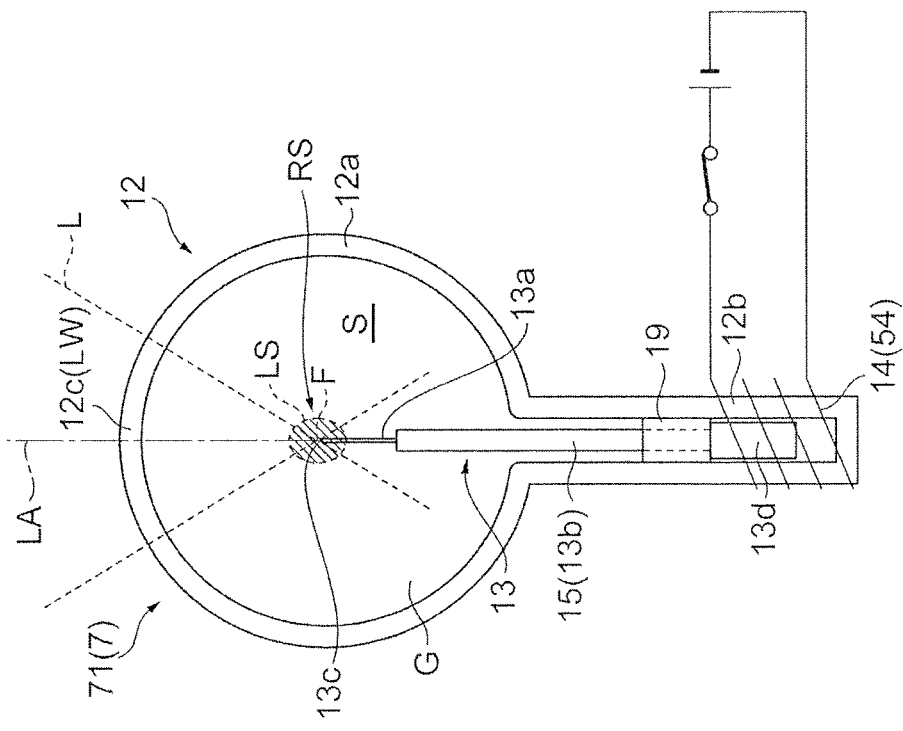

LIGHT SOURCE DEVICE

This is a continuation application of copending Application Ser. No. 15/478,306, having a filing date of Apr. 4, 2017, which is a continuation of application Ser. No. 15/022,222 having a § 371 date of Mar. 16, 2016, which issued as U.S. Pat. No. 9,646,816 on May 9, 2017, which is a national stage filing based on PCT International Application No. PCT/JP2014/080345, filed on Nov. 17, 2014. The copending Application Ser. No. 15/478,306 and Application Ser. No. 15/022,222 are incorporated by reference herein in their entireties.

TECHNICAL FIELD

The present invention relates to a light source device.

BACKGROUND ART

Conventionally, light source devices that radiate a laser light to a casing of a light emission sealing body filled with light emission gas and use generated plasma are known (for example, refer to Patent Literatures 1 and 2). For example, in a light source device described in Patent Literature 1, feeding is performed between counter electrodes disposed in a casing made of glass to generate plasma by discharge between the electrodes and a laser light is continuously radiated to the plasma, so that a laser support light to be a plasma emission is put on/maintained. In addition, for example, in a light source device described in Patent Literature 2, a pulsed laser light is radiated to an electron emission metal disposed in a xenon lamp, so that a pulsed plasma emission is put on.

CITATION LIST

Patent Literature

Patent Literature 1: Japanese Patent Application National Publication (Laid-Open) No. 2009-532829
Patent Literature 2: Japanese Patent Application Laid-Open No. H4-144053

SUMMARY OF INVENTION

Technical Problem

However, in the light source device described in Patent Literature 1, the counter electrodes are sputtered by continuously generating the plasma between the counter electrodes and a life of the light emission sealing body is shortened by consumption of the counter electrodes. In addition, a sputtered material is adhered to an inner wall of the casing, so that incidence of the laser light or extraction of the laser support light is obstructed. For this reason, light emission strength of the laser support light gradually decreases and the life of the light emission sealing body is shortened.

In addition, it is considered that, instead of the pulsed laser light, a continuous laser light is used to cause the pulsed plasma emission to become a continuous light in the light source device described in Patent Literature 2. However, when the continuous laser light is continuously radiated to the electron emission metal, the electron emission metal is sputtered by the continuous laser light and the life of the light emission sealing body is shortened by consumption of the electron emission metal. In addition, the sputtered material is adhered to the inner wall of the casing, so that the incidence of the laser light or the extraction of the laser support light is obstructed. For this reason, the light emission strength of the laser support light gradually decreases and the life of the light emission sealing body is shortened.

The present invention has been made to resolve the above problem and an object of the present invention is to provide a light source device that suppresses sputtering in a casing and realizes a sufficiently long life.

Solution to Problem

In order to resolve the above problem, a light source device according to the present invention includes: a laser unit that emits a laser light; a light source that has a light emission sealing body of which an internal space is filled with light emission gas and a lighting start region provided in the internal space; an optical system that guides the laser light to the internal space; and a control unit that controls an energy density of the laser light in the lighting start region, wherein the light source maintains a laser support light to be a plasma emission of the light emission gas put on by radiation of the laser light from the laser unit, by the radiation of the laser light from the laser unit, in the internal space, and the control unit causes the energy density of the laser light in the lighting start region when the laser support light is maintained to be lower than the energy density of the laser light in the lighting start region when the laser support light put on.

In the light source device, the control unit causes the energy density of the laser light in the lighting start region when the laser support light is maintained to be lower than the energy density of the laser light in the lighting start region when the laser support light put on. For this reason, when the laser support light is maintained, the laser light is radiated to the lighting start region at an energy density of a degree where sputtering does not occur. Therefore, in the light source device, because sputtering in the light emission sealing body can be suppressed, a sufficiently long life can be realized.

The light source may further have an electron emission structure that is disposed in the internal space and contains an easily electron-emitting material emitting electrons by the radiation of the laser light. In this case, sputtering of the electron emission structure can be suppressed.

The light source may further have counter electrodes that face each other to interpose the lighting start region therebetween. In this case, generation of plasma between the counter electrodes can be suppressed to a degree where sputtering does not occur.

The control unit preferably has a condensing position movement unit that moves a condensing position of the laser light when the laser support light is maintained in a direction separated from the lighting start region, with respect to a condensing position of the laser light when the laser support light is put on. In this case, when the laser support light is maintained, the condensing position of the laser light is separated from the lighting start region. Therefore, sputtering in the light emission sealing body can be surely suppressed.

The condensing position movement unit preferably moves the condensing position of the laser light in a direction of an optical axis of the laser light. In this case, when the laser support light is maintained, the condensing position of the laser light can be easily separated from the lighting start region.

The condensing position movement unit preferably has an optical path length adjustment unit that adjusts an optical path length of the laser light in the internal space. In this case, the optical path length adjustment unit is used, so that the condensing position of the laser light can be easily separated from the lighting start region when the laser support light is maintained while the condensing position of the laser light is maintained at an appropriate position when the laser support light is put on.

The condensing position movement unit preferably has an optical system movement unit that moves a position of the optical system when the laser support light is maintained, with respect to a position of the optical system when the laser support light is put on. In this case, the optical system is moved, so that the condensing position of the laser light can be easily separated from the lighting start region.

The condensing position movement unit preferably has a light emission sealing body movement unit that moves a position of the light emission sealing body when the laser support light is maintained, with respect to a position of the light emission sealing body when the laser support light is put on. In this case, the light emission sealing body is moved, so that the condensing position of the laser light can be easily separated from the lighting start region.

The optical system preferably condenses the laser light at a position separated from the lighting start region, both when the laser support light is put on and when the laser support light is maintained. In this case, because the condensing position of the laser light having the highest energy density is a position other than the lighting start region at all times, sputtering in the light emission sealing body can be suppressed. Therefore, a sufficiently long life of the light source device can be realized.

The control unit preferably causes emission energy of the laser light from the laser unit when the laser support light is maintained to be lower than emission energy of the laser light from the laser unit when the laser support light is put on. In this case, because it is not necessary to mechanically move the condensing position of the laser light, the condensing position of the laser light can be maintained at an appropriate position.

When the light source further has the electron emission structure, the control unit preferably has a condensing position movement unit that moves a condensing position of the laser light when the laser support light is maintained in a direction separated from the electron emission structure, with respect to a condensing position of the laser light when the laser support light is put on. In this case, when the laser support light is maintained, the condensing position of the laser light is separated from the electron emission structure. Therefore, the electron emission structure can be surely suppressed from being sputtered.

When the light source further has the electron emission structure, the condensing position movement unit preferably has an electron emission structure movement unit that moves a position of the electron emission structure when the laser support light is maintained, with respect to a position of the electron emission structure when the laser support light is put on. In this case, the electron emission structure is moved, so that the condensing position of the laser light can be easily separated from the electron emission structure.

When the light source further has the electron emission structure, the condensing position movement unit preferably has an optical path length adjustment unit that causes an optical path length of the laser light when the laser support light is maintained in the internal space to be shorter than an optical path length of the laser light when the laser support light is put on in the internal space. In this case, the optical path length adjustment unit is used, so that the condensing position of the laser light can be easily separated from the electron emission structure when the laser support light is maintained while the condensing position of the laser light is maintained at an appropriate position when the laser support light is put on.

When the light source further has the electron emission structure, the condensing position movement unit preferably moves a condensing position of the laser light in a direction intersecting with a direction of an optical axis of the laser light. In this case, when the laser support light is maintained, the condensing position of the laser light can be easily separated from the electron emission structure.

When the light source further has the electron emission structure, the condensing position movement unit preferably has an optical system movement unit that moves a position of the optical system when the laser support light is maintained, with respect to a position of the optical system when the laser support light is put on. In this case, the optical system is moved, so that the condensing position of the laser light can be easily separated from the electron emission structure.

When the light source further has the electron emission structure, the condensing position movement unit preferably has a light emission sealing body movement unit that moves a position of the light emission sealing body when the laser support light is maintained, with respect to a position of the light emission sealing body when the laser support light is put on. In this case, the light emission sealing body is moved, so that the condensing position of the laser light can be easily separated from the electron emission structure.

When the light source further has the electron emission structure, in the electron emission structure, a surface where there is a condensing position of the laser light when the laser support light is put on is preferably formed to be inclined to the optical axis of the laser light. By this configuration, the condensing position of the laser light can be set to a position on a surface of the electron emission structure, even though the optical system is not adjusted strictly.

Advantageous Effects of Invention

According to the present invention, sputtering in a casing is suppressed and a sufficiently long life is realized.

BRIEF DESCRIPTION OF DRAWINGS

FIG. 3 is a diagram illustrating a state of the optical member (optical path length adjustment unit) illustrated in FIG. 2 before a laser support light is put on.

FIG. 4 is a diagram illustrating a state of the optical member (optical path length adjustment unit) illustrated in FIG. 2 when the laser support light is put on.

FIG. 6 is a diagram illustrating a state of an optical member (optical path length adjustment unit) according to a modification of the first embodiment when the laser support light is put on.

FIG. 7 is a diagram illustrating a state of the optical member (optical path length adjustment unit) illustrated in FIG. 6 after the laser support light is put on (when the laser support light is maintained).

FIG. 9 is a diagram illustrating a state of a light source device according to a second embodiment of the present invention when the laser support light is put on.

FIG. 11 is a diagram illustrating a state of a light source device according to a third embodiment of the present invention when the laser support light is put on.

FIG. 13 is a diagram illustrating a state of a light emission sealing body configuring a light source device according to a fourth embodiment of the present invention when the laser support light is put on.

FIGS. 15A and 15B are diagrams illustrating a light emission sealing body configuring a light source device according to a modification of the fourth embodiment, specifically, FIG. 15A illustrates a state when the laser support light is put on and FIG. 15B illustrates a state after the laser support light is put on (when the laser support light is maintained).

FIG. 17A illustrates a function when the laser support light is put on and FIG. 17B illustrates a function after the laser support light is put on (when the laser support light is maintained).

FIG. 18 is a diagram illustrating a state of a light source device according to a sixth embodiment of the present invention before the laser support light is put on.

FIG. 19 is a diagram illustrating a state of the light source device illustrated in FIG. 18 when the laser support light is put on.

FIG. 24 is a diagram illustrating a state of an optical member (optical path length adjustment unit) illustrated in FIG. 23 when the laser support light is put on.

FIG. 25 is a diagram illustrating a state of the optical member (optical path length adjustment unit) illustrated in FIG. 23 after the laser support light is put on.

FIG. 26 is a diagram illustrating another aspect of an optical member (optical path length adjustment unit) illustrated in FIG. 23 when the laser support light is put on.

FIG. 27 is a diagram illustrating another aspect of the optical member (optical path length adjustment unit) illustrated in FIG. 23 after the laser support light is put on.

FIG. 28 is a diagram illustrating a state of a light source device according to an eighth embodiment of the present invention when the laser support light is put on.

FIG. 29 is a diagram illustrating a state of the light source device illustrated in FIG. 28 after the laser support light is put on.

FIG. 30 is a diagram illustrating a state of a light source device according to a ninth embodiment of the present invention when the laser support light is put on.

FIG. 31 is a diagram illustrating a state of the light source device illustrated in FIG. 30 after the laser support light is put on.

FIG. 33A illustrates a function when the laser support light is put on and FIG. 33B illustrates a function after the laser support light is put on.

DESCRIPTION OF EMBODIMENTS

Hereinafter, preferred embodiments of a light source device according to the present invention will be described in detail with reference to the drawings.

First Embodiment

Figure 1:
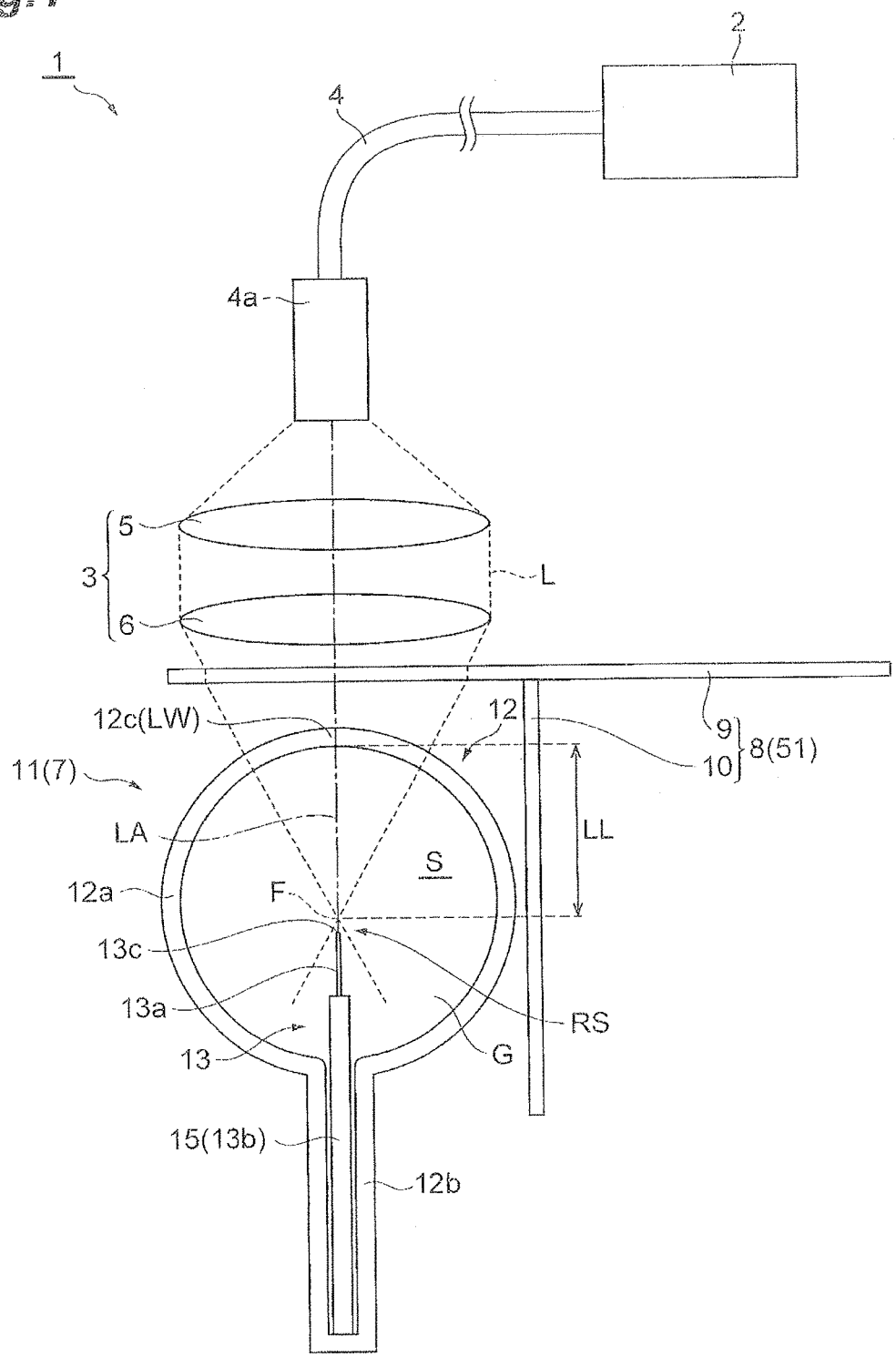
FIG. 1 is a diagram illustrating a light source device according to a first embodiment of the present invention.

FIG. 1 is a schematic diagram illustrating a light source device according to a first embodiment of the present invention. As illustrated in the same drawing, a light source device 1 includes a laser unit 2 that emits a continuous laser light, an optical system 3 that guides the continuous laser light L from the laser unit 2, and a light emission sealing body 11 (light source 7) that stores a metal structure (electron emission structure) 13 containing an easily electron-emitting material emitting electrons by radiation of the continuous laser light L and light emission gas G. In the light source device 1, if the continuous laser light L is radiated to the metal structure 13, plasma by the light emission gas G is generated in a radiation region of the continuous laser light L in the vicinity of the metal structure 13. In addition, it is assumed that the plasma is generated when electrons emitted from the metal structure 13 by radiation of the continuous laser light L ionize the light emission gas G and the continuous laser light L is radiated to the ionized light emission gas G. In addition, the continuous laser light L is continuously radiated to the generated plasma (laser energy is continuously supplied to the plasma), so that a laser support light of a high brightness to be a plasma emission having a predetermined light emission region (lighting start region RS) including a condensing position F of the continuous laser light L can be put on/maintained in the light emission sealing body 11 to be the light source 7. The laser support light is used as a light source for semiconductor inspection or a light for spectroscopic measurement, for example.

The laser unit 2 is a laser diode, for example. The continuous laser light L having a wavelength according to an absorption spectrum of the light emission gas G, for example, a wavelength of 980 nm is emitted from the laser unit 2. A pulsed laser light may be emitted from the laser unit 2. An output of the continuous laser light L is about 60 W, for example. The continuous laser light L emitted from the laser unit 2 is guided to the optical system 3 by an optical fiber 4. The optical system 3 is an optical system that condenses the continuous laser light L from the laser unit 2 toward the light emission sealing body 11. The optical system 3 is configured by two lenses 5 and 6, for example. After the continuous laser light L emitted from a head 4a of the optical fiber 4 becomes parallel light by the lens 5, the continuous laser light L is condensed toward the light emission sealing body 11 with an optical axis LA by the lens 6. A diameter of the condensed continuous laser light L is a diameter of about 120 µm, for example.

More specifically, the light emission sealing body 11 is configured by a bulb (casing) 12 of which an internal space S is filled with the light emission gas G at a high pressure and the metal structure 13 containing the easily electron-emitting material emitting the electrons by radiation of the continuous laser light L.

The bulb 12 is formed hollowly using glass, for example, and has a spherical portion (body portion) 12a having the metal structure 13 positioned therein and having a spherical outer shape and the spherical internal space S and a protrusion portion 12b protruding from a part of the spherical portion 12a cylindrically. The internal space S of the bulb 12 is filled with the light emission gas G, for example, xenon gas, at a high pressure. In this embodiment, a top portion 12c of the spherical portion 12a positioned at the side opposite to the protrusion portion 12b corresponds to an incidence portion (laser incidence window portion LW) of the continuous laser light L. The laser incidence window portion LW may face an incidence portion of the continuous laser light L in the metal structure 13 to be described below and may be positioned at a portion other than the top portion 12c of the spherical portion 12a.

The metal structure 13 is formed of a metal having a high melting point such as tungsten and has an electron emission unit 13a containing barium as the easily electron-emitting material and a support unit 13b supporting the electron emission unit 13a. As illustrated in FIG. 1, the electron emission unit 13a to which the continuous laser light L is radiated is formed in a shape of a cylinder having a small diameter and is disposed in the spherical portion 12a in a state in which a leading end 13c becoming an incidence portion of the continuous laser light L is disposed toward the top portion 12c (laser incidence window portion LW) of the bulb 12. The incidence portion of the continuous laser light L is not limited to the leading end 13c and may be a side portion of the electron emission unit 13a.

Meanwhile, the support unit 13b has a rod-shaped member 15 that is formed cylindrically using a metal having a high melting point such as molybdenum. The electron emission unit 13a (leading end 13c) is supported to a leading end side of the support unit 13b to be disposed at a desired position of the internal space S in the spherical portion 12a and a base end side of the support unit 13b is disposed in the internal space S in the protrusion portion 12b. Materials configuring the electron emission unit 13a and the support unit 13b do not need to be changed and the support unit 13b may be formed integrally using a material used for the electron emission unit 13a. In addition, a base may be formed integrally using the same metal and the easily electron-emitting material may be contained in only a portion corresponding to the electron emission unit 13a. In addition, the electron emission unit 13a or the metal structure 13 may be formed of the easily electron-emitting material. The electron emission structure is not limited to the metal structure configured from the base of the metal (conductive material) such as the tungsten and the molybdenum and may be configured from a base of an insulating material such as ceramic.

As described above, in the light emission sealing body 11, the metal structure 13 containing the easily electron-emitting material is stored in the bulb 12 filled with the light emission gas G. By using the metal structure 13, in the light emission sealing body 11, the plasma is generated by radiating the continuous laser light L to the metal structure 13 and the continuous laser light L is continuously radiated to the plasma, so that the laser support light of the high brightness can be put on/maintained in the lighting start region RS. When the plasma emission is extracted from the light emission sealing body 11, the plasma emission is preferably extracted from a direction intersecting with the optical axis LA of the continuous laser light L and is more preferably extracted from a direction orthogonal to the optical axis LA.

Figure 2:
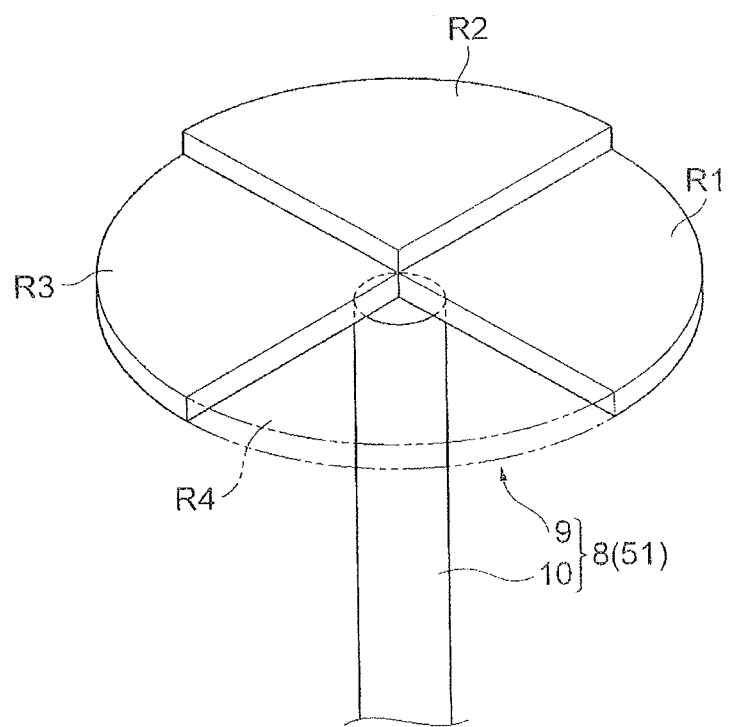
FIG. 2 is a diagram illustrating an example of an optical member (optical path length adjustment unit) included in the light source device illustrated in FIG. 1.

The light source device 1 further includes an optical path length adjustment unit 51 adjusting an optical path length of the continuous laser light L as a condensing position movement unit. More specifically, the optical path length adjustment unit 51 adjusts an optical path length LL to be a length of the optical axis LA of the continuous laser light L from the laser incidence window portion LW to the condensing position F, in the internal space S of the bulb 12. As the optical path length adjustment unit 51, an optical member 8 illustrated in FIG. 2 is used. The optical member 8 is configured by a plate-shaped transparent medium 9 and a rod-shaped rotation actuator 10 supporting the transparent medium 9. The transparent medium 9 can rotate in an axial direction of the rotation actuator 10, by the rotation actuator 10. In the light source device 1, the optical member 8 is disposed such that the transparent medium 9 is interposed between the optical system 3 and the light emission sealing body 11.

The transparent medium 9 is formed of a material such as synthetic quartz glass, which has a refractive index higher than a refractive index of air (laser light radiation atmosphere outside the light emission sealing body 11). In addition, the transparent medium 9 has a plane shape of a ¾ circle as illustrated in FIG. 2 and in the transparent medium 9, a thickness (transmission length of the continuous laser light L) of a direction of the optical path LA of the continuous laser light L is different for each ¼ circle. Specifically, the transparent medium 9 is configured by a first region R1 having a plane shape of a ¼ circle with a thickness of about 2 mm, for example, a second region R2 adjacent to the first region R1 and having a plane shape of a ¼ circle with a thickness of about 4 mm, for example, and a third region R3 adjacent to the second region R2 and having a plane shape of a ¼ circle with a thickness of about 2 mm, for example. For convenience, a region which is interposed between the first region R1 and the third region R3 and in which the transparent medium 9 does not exist is called a fourth region R4.

Figure 3:
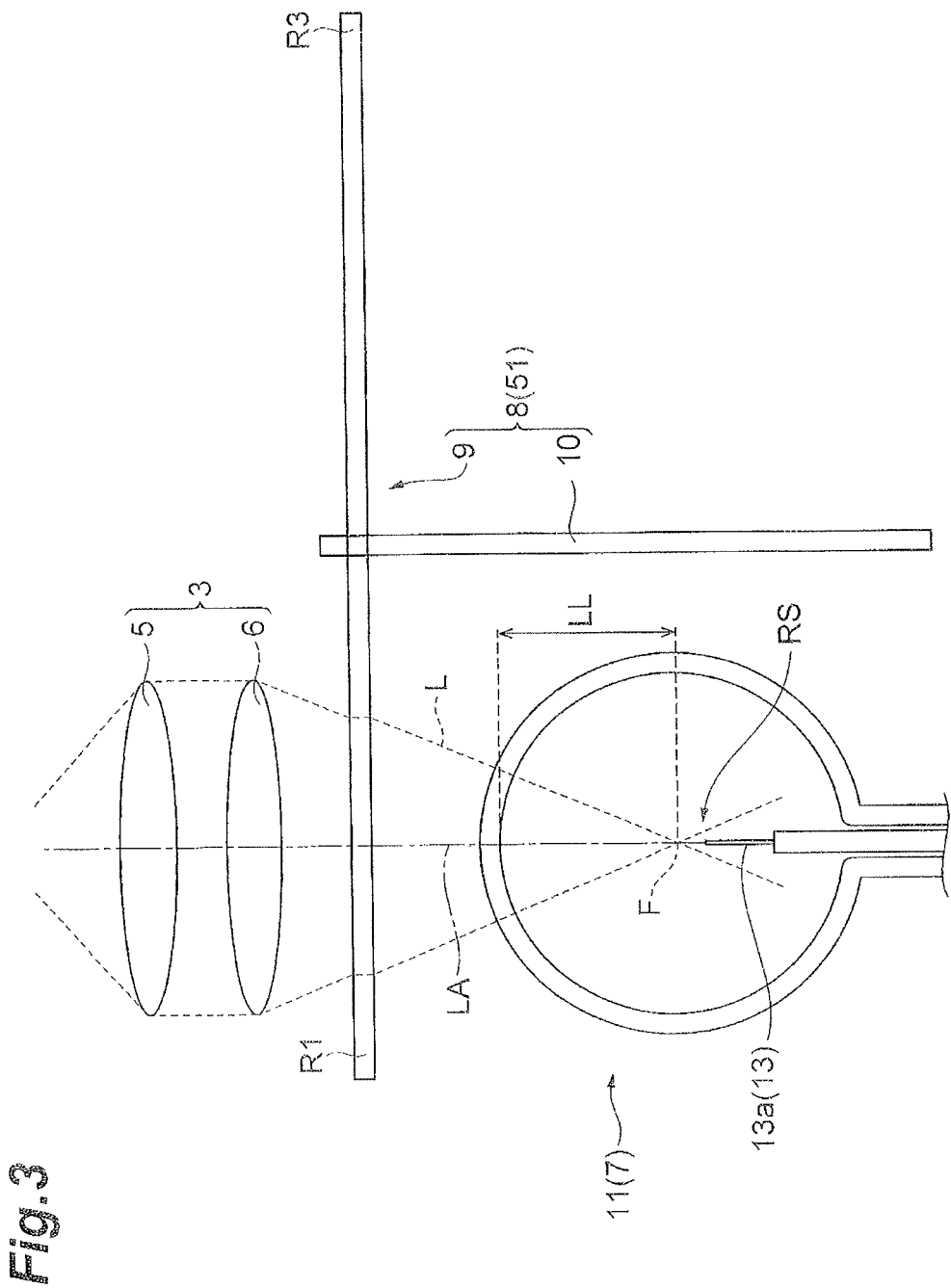
Figure 4:
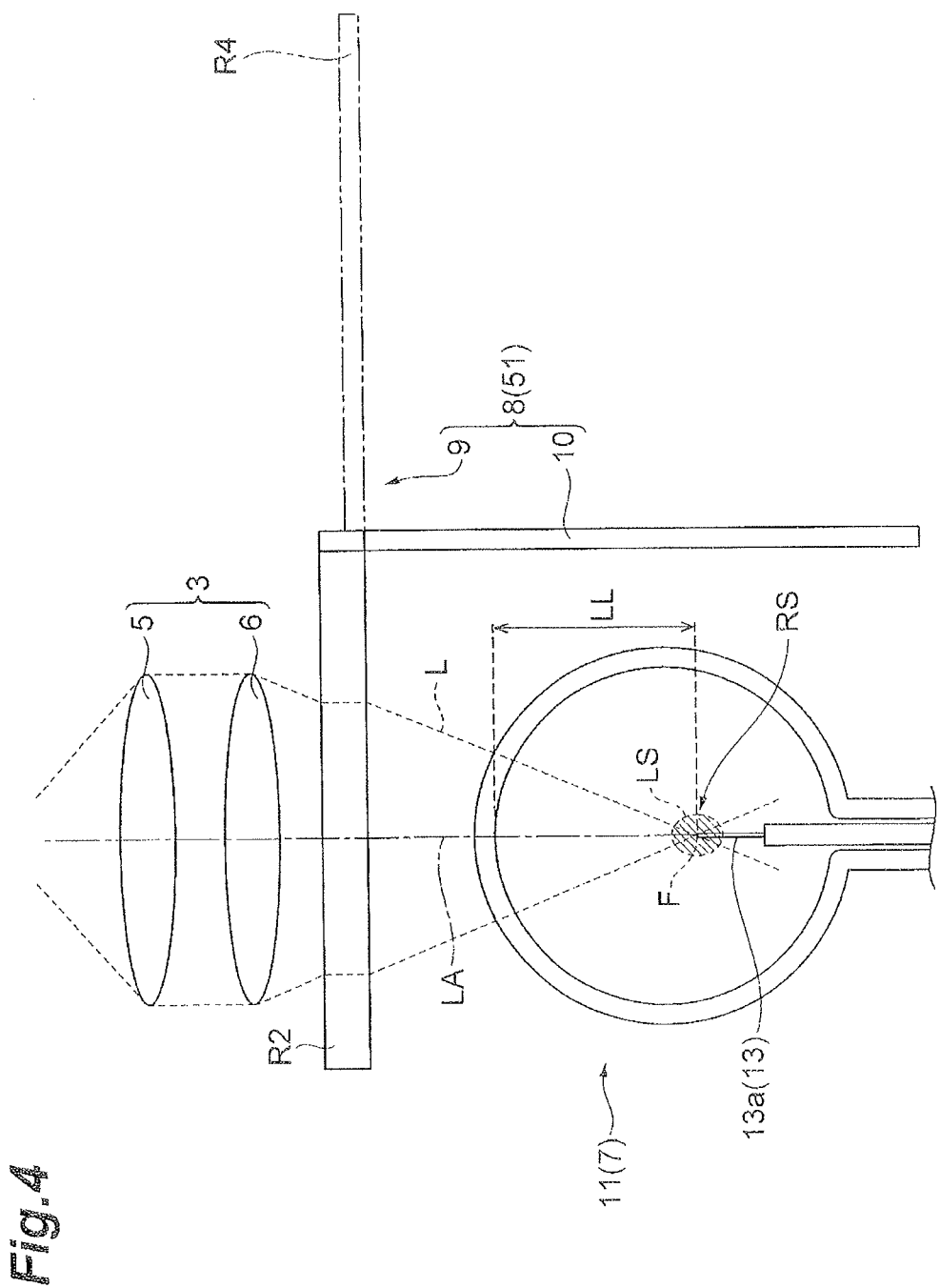
Figure 5:
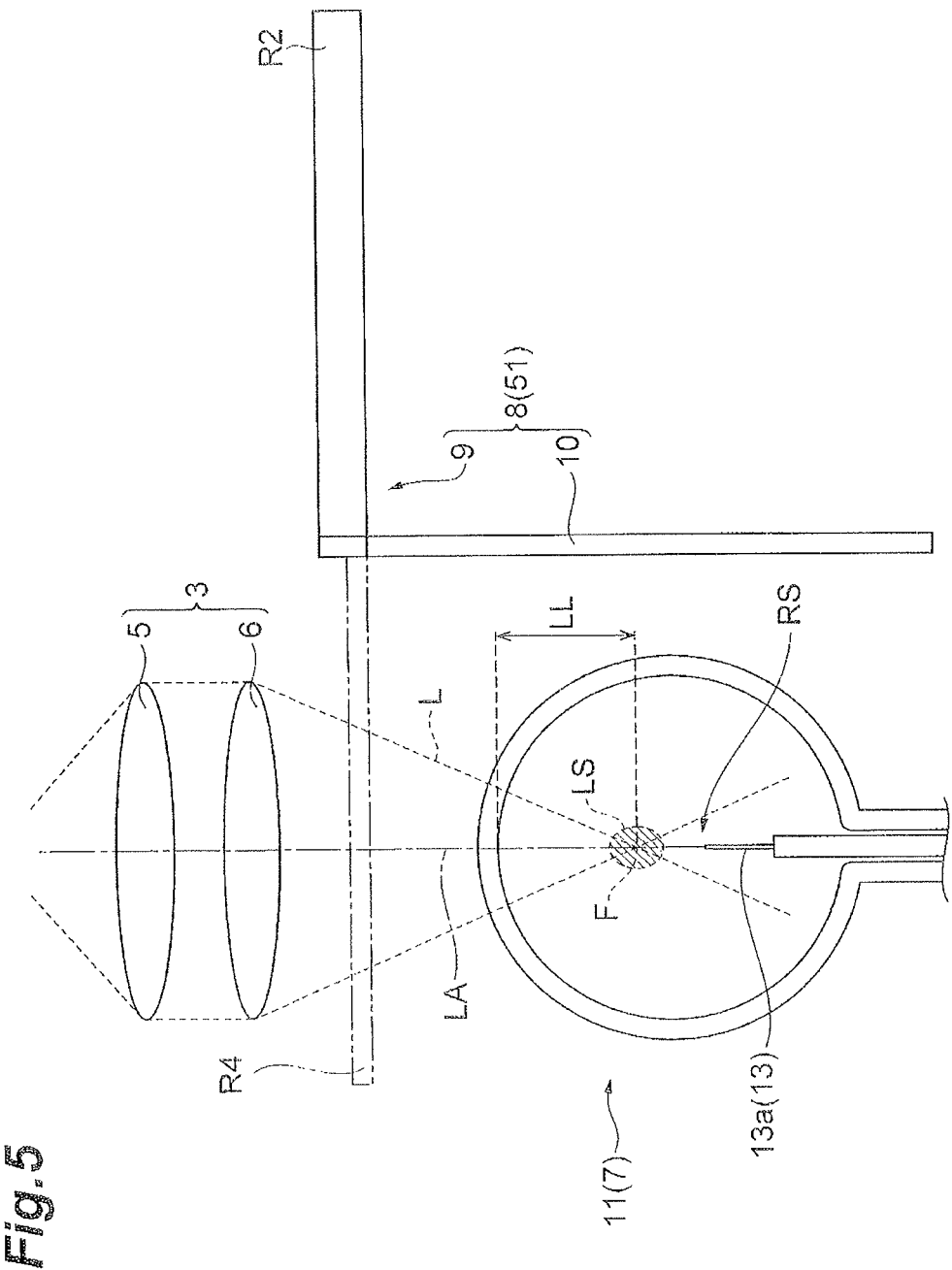
FIG. 5 is a diagram illustrating a state of the optical member (optical path length adjustment unit) illustrated in FIG. 2 after the laser support light is put on (when the laser support light is maintained).

FIGS. 3 to 5 are cross-sectional views illustrating functions of the optical member 8 (optical path length adjustment unit 51). First, as illustrated in FIG. 3, before the laser support light is put on, the first region R1 of the transparent medium 9 is interposed between the optical system 3 and the light emission sealing body 11. As a result, the continuous laser light L is refracted by the transparent medium 9 and the condensing position F of the continuous laser light L is positioned in a space region between the electron emission unit 13a (metal structure 13) and the laser incidence window portion LW. At this time, an energy density of the continuous laser light L on a surface (lighting start region RS) of the electron emission unit 13a (metal structure 13) is about 260 kW/cm$^2$, for example.

Next, as illustrated in FIG. 4, when the laser support light LS is put on, the transparent medium 9 is rotated by the rotation actuator 10 from a state of FIG. 3, so that the second region R2 of the transparent medium 9 is interposed between the optical system 3 and the light emission sealing body 11. In this case, because the second region R2 of the transparent medium 9 is thicker than the first region R1, the condensing position F of the continuous laser light L moves to the side of the metal structure 13, with respect to the condensing position F of the continuous laser light L before the laser support light LS is put on. As a result, when the laser support light LS is put on, the continuous laser light L is condensed at nearly the surface of the electron emission unit 13a (metal structure 13) and the energy density of the continuous laser light L on the surface (lighting start region RS) of the electron emission unit 13a (metal structure 13) is about 530 kW/cm$^2$, for example.

Next, after the laser support light LS is put on (when the laser support light LS is maintained), the transparent medium 9 is rotated by the rotation actuator 10 from a state of FIG. 4, so that the fourth region R4 is interposed between the optical system 3 and the light emission sealing body 11, as illustrated in FIG. 5. In this case, because the transparent medium does not exist in the fourth region R4, the condensing position F of the continuous laser light L moves to a space area of a position (position closer to the laser incidence window portion LW) further separated from the metal structure 13 (lighting start region RS) in the direction of the optical axis LA of the continuous laser light L, with respect to the condensing positions F of the continuous laser light L before the laser support light LS is put on (FIG. 3) and when the laser support light LS is put on (FIG. 4). At this time, the energy density of the continuous laser light L on the surface (lighting start region RS) of the electron emission unit 13a (metal structure 13) is about 260 kW/cm$^2$ or less, for example.

As such, the optical path length LL of the continuous laser light L in the internal space S is adjusted by adjusting the thickness of the transparent medium 9 interposed between the optical system 3 and the light emission sealing body 11 and the condensing position F of the continuous laser light L is moved. As a result, the energy density of the continuous laser light L on the surface (lighting start region RS) of the electron emission unit 13a (metal structure 13) can be set to an energy density suitable for each state before the laser support light LS is put on, when the laser support light LS is put on, and after the laser support light LS is put on (when the laser support light LS is maintained). More specifically, before the laser support light LS is put on, the continuous laser light L is radiated to the electron emission unit 13a (metal structure 13) at an energy density of a degree where sputtering does not occur, so that the electron emission unit 13a (metal structure 13) can be heated. For this reason, electrons can be easily emitted from the electron emission unit 13a (metal structure 13) when the laser support light LS is put on thereafter and the laser support light LS can be easily put on. In addition, when the laser support light LS is put on, the continuous laser light L can be radiated to an appropriate position of the electron emission unit 13a (metal structure 13) at an energy density sufficient for lighting the laser support light LS, so that the laser support light LS can be surely put on in the lighting start region RS. After the laser support light LS is put on (when the laser support light LS is maintained), the laser support light LS can be maintained and the energy density can be set to the energy density of the degree where the sputtering does not occur in the metal structure 13. When the condensing position F of the continuous laser light L is separated from the electron emission unit 13a (metal structure 13 (lighting start region RS)), the laser support light LS to be the plasma emission is also separated from the electron emission unit 13a (metal structure 13 (lighting start region RS)). For this reason, the sputtering of the metal structure 13 by the laser support light LS can be suppressed. Therefore, because a long life of the light emission sealing body 11 (light source 7) can be realized by suppressing deterioration of the metal structure 13 and contamination of an inner wall of the bulb 12 by the sputtering, a sufficiently long life of the light source device can be realized.

After the laser support light LS is put on, the third region R3 having the intermediate thickness of the thickness of the second region R2 and the thickness of the fourth region R4 is interposed in the middle of changing a region interposed between the optical system 3 and the light emission sealing body 11 from the second region R2 to the fourth region R4. As a result, the condensing position F of the continuous laser light L can be moved such that the condensing position F is separated from the metal structure 13 stepwise. For this reason, the light emission region of the laser support light LS can also be moved such that the light emission region is separated from the metal structure 13 (lighting start region RS) stepwise. Therefore, parts of the light emission regions before and after the condensing position F of the continuous laser light L moves easily overlap each other and the plasma is easily maintained, so that the laser support light LS is easily maintained. Meanwhile, when the region interposed between the optical system 3 and the light emission sealing body 11 changes from the second region R2 to the fourth region R4 at a stroke, the condensing position F of the continuous laser light L is also moved at a stroke, so that the plasma may not follow the movement of the condensing position F. For this reason, it is difficult to maintain the plasma and the laser support light LS may be extinguished.

Figure 6:
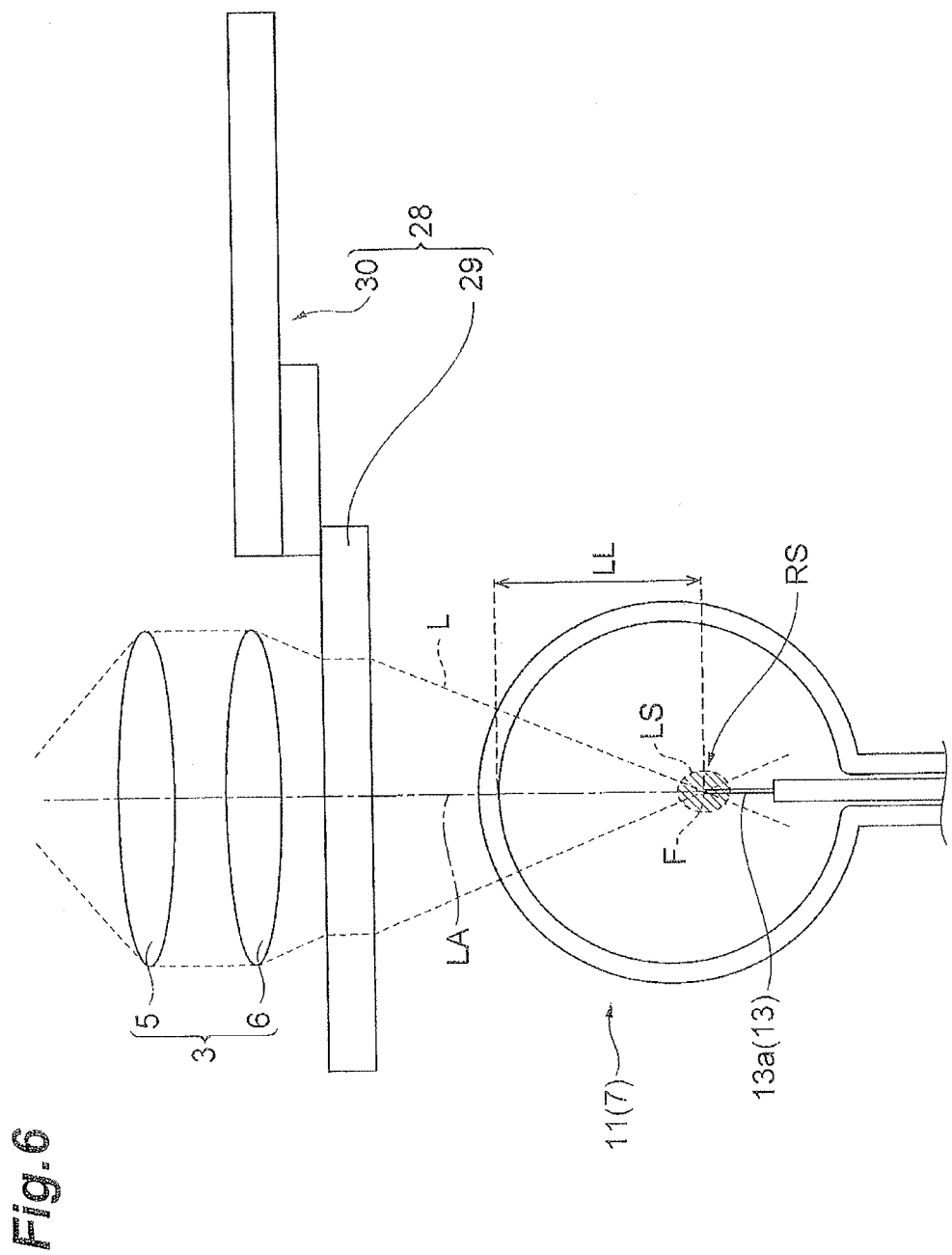

The configuration of the optical member 8 (optical path length adjustment unit 51) can take another aspect. The optical member 8 may be configured by a light modulation element such as a spatial light modulation element. In addition, the optical member 8 may be an optical member 28 configured by a plate-shaped transparent medium 29 in which a thickness (transmission length of the continuous laser light L) of the direction of the optical axis LA of the continuous laser light L is nearly uniform and an actuator 30 holding the transparent medium 29, for example, as illustrated in FIGS. 6 and 7. The transparent medium 29 held by the actuator 30 moves in a direction nearly orthogonal to the optical axis LA of the continuous laser light L, according to states when the laser support light LS is put on and after the laser support light LS is put on (when the laser support light LS is maintained).

That is, when the laser support light LS is put on, the transparent medium 29 is interposed between the optical system 3 and the light emission sealing body 11, as illustrated in FIG. 6. At this time, similar to the state when the laser support light LS is put on in the first embodiment, the continuous laser light L is condensed at nearly the surface (lighting start region RS) of the electron emission unit 13a (metal structure 13). Meanwhile, after the laser support light LS is put on (when the laser support light LS is maintained), the transparent medium 29 is moved not to be interposed between the optical system 3 and the light emission sealing body 11 by the actuator 30, as illustrated in FIG. 7. In this case, similar to the state after the laser support light LS is put on in the first embodiment, the condensing position F of the continuous laser light L moves to the position separated from the metal structure 13 (lighting start region RS) of the direction of the optical axis LA of the continuous laser light L, with respect to the condensing position F of the continuous laser light L when the laser support light LS is put on. Therefore, even in this case, the sputtering of the metal structure 13 can be suppressed, similar to the first embodiment.

Figure 8A:
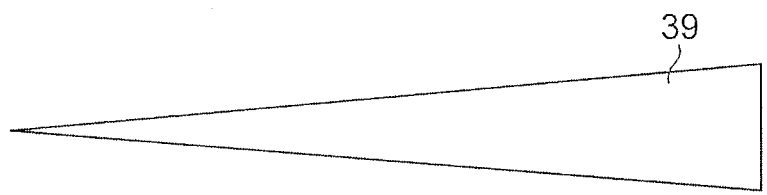
FIGS. 8A and 8B are diagrams illustrating a transparent medium configuring an optical member (optical path length adjustment unit) according to another modification of the first embodiment.

Instead of the transparent medium 29, a transparent medium 39 illustrated in FIG. 8A can be used. The transparent medium 39 has a plate shape in which one surface is inclined to another surface and the thickness (transmission length of the continuous laser light L) of the direction of the optical axis LA of the continuous laser light L continuously changes and the transparent medium 39 is used in a state in which the transparent medium 39 is held by the actuator 30, similar to the transparent medium 29.

In the case of using the transparent medium 39, when the laser support light LS is put on, the transparent medium 39 is interposed between the optical system 3 and the light emission sealing body 11, such that the continuous laser light L is condensed at nearly the surface (lighting start region RS) of the electron emission unit 13a (metal structure 13). Next, after the laser support light LS is put on (when the laser support light LS is maintained), the transparent medium 39 is moved not to be interposed between the optical system 3 and the light emission sealing body 11 by the actuator 30. At this time, because one surface of the transparent medium 39 is inclined to another surface thereof, the condensing position F of the continuous laser light L also moves continuously to be gradually separated from the metal structure 13 (lighting start region RS), according to the movement of the transparent medium 39. As a result, the light emission region of the laser support light LS can also move to be gradually separated from the metal structure 13 (lighting start region RS). Therefore, the parts of the light emission region before and after the condensing position F of the continuous laser light L moves overlap each other, so that the plasma is easily maintained. Therefore, the laser support light LS is easily maintained.

Figure 8B:
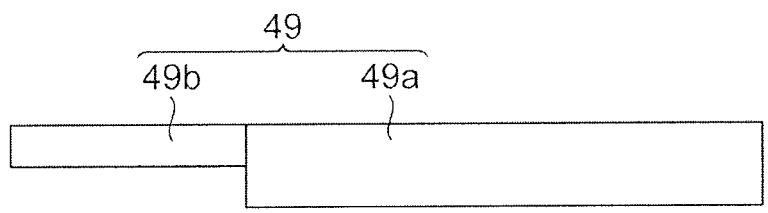

Instead of the transparent medium 29, a transparent medium 49 illustrated in FIG. 8B can be used. The transparent medium 49 is formed by bonding two members in which a thickness (transmission length of the continuous laser light L) of the direction of the optical axis LA of the continuous laser light L is different and is configured by bonding end faces of a first transparent medium 49a having a thickness of about 4 mm, for example, and a second transparent medium 49b having a thickness of about 2 mm, for example.

In the case of using the transparent medium 49, when the laser support light LS is put on, the first transparent medium 49a is interposed between the optical system 3 and the light emission sealing body 11, such that the continuous laser light L is condensed at nearly the surface (lighting start region RS) of the electron emission unit 13a (metal structure 13). Next, after the laser support light LS is put on (when the laser support light LS is maintained), the transparent medium 49 is moved not to be interposed between the optical system 3 and the light emission sealing body 11 by the actuator 30. At this time, because the transparent medium 49 is configured by the transparent mediums 49a and 49b of which the thickness is different, the condensing position F of the continuous laser light L also moves to be separated from the metal structure 13 (lighting start region RS) stepwise, according to the movement of the transparent medium 49. As a result, the light emission region of the laser support light LS can also be moved to be separated from the metal structure 13 (lighting start region RS) stepwise. Therefore, the parts of the light emission region before and after the condensing position F of the continuous laser light L moves easily overlap each other, so that the plasma is easily maintained. Therefore, the laser support light LS is easily maintained.

Second Embodiment

Figure 9:
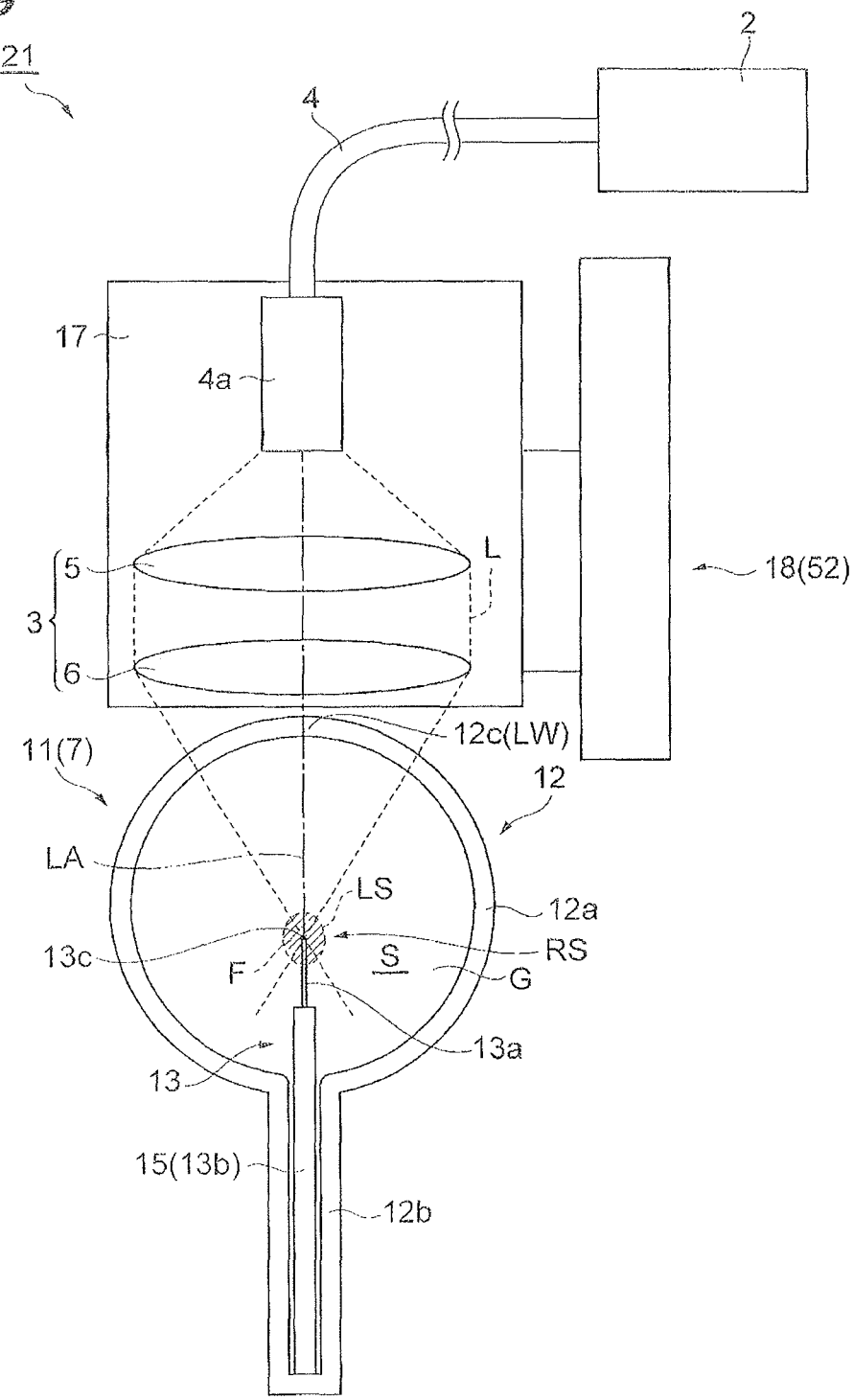
Figure 10:
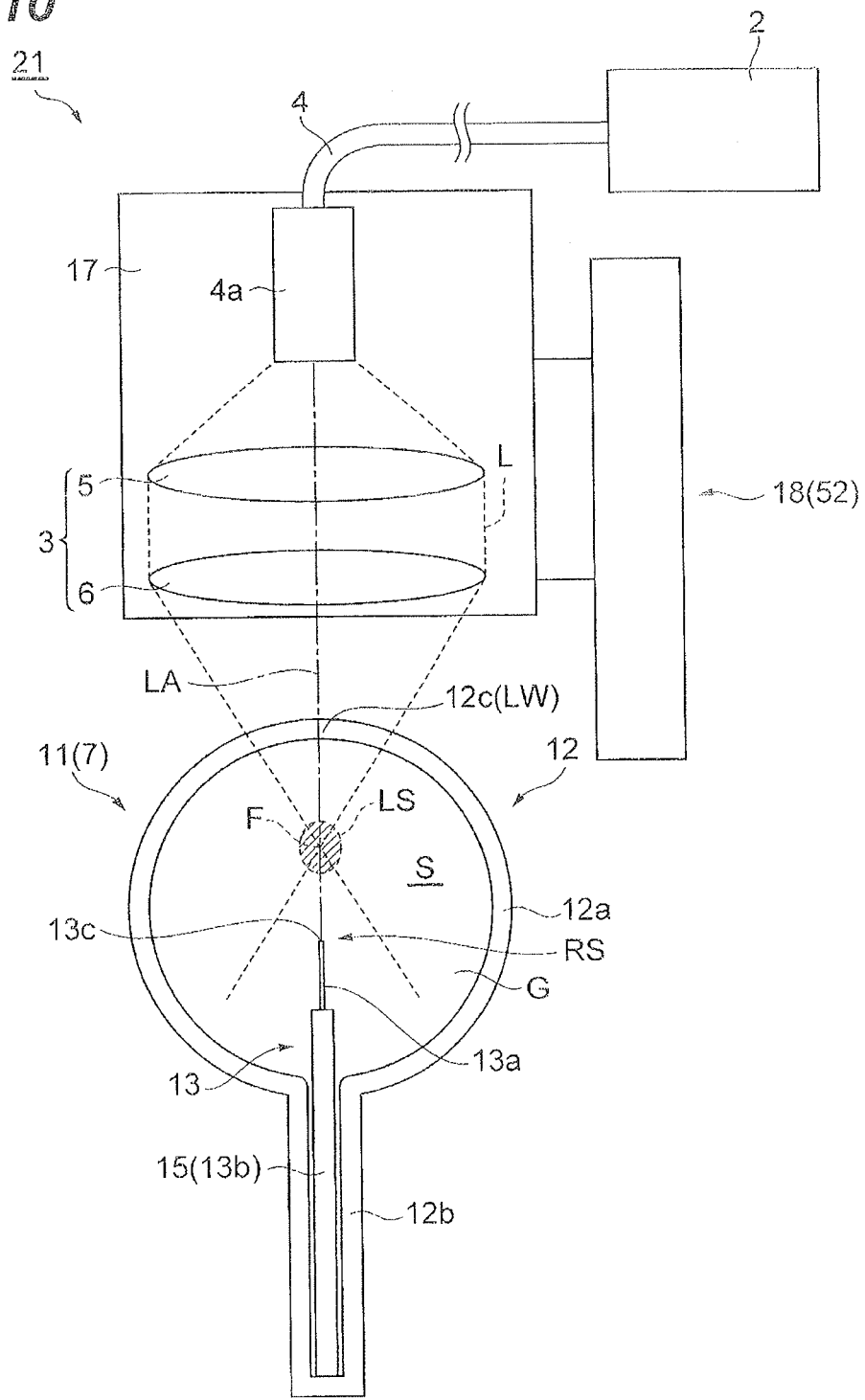
FIG. 10 is a diagram illustrating a state of the light source device illustrated in FIG. 9 after the laser support light is put on (when the laser support light is maintained).

FIGS. 9 and 10 are diagrams illustrating a light source device according to a second embodiment of the present invention. Hereinafter, the light source device according to the second embodiment will be described. However, description overlapped to the description of the first embodiment is omitted. As illustrated in FIGS. 9 and 10, in a light source device 21, an optical system 3 and a head 4a of an optical fiber 4 are stored in a casing 17. The casing 17 is held by an actuator 18 (optical system movement unit 52) functioning as a condensing position movement unit and is moved in a direction of an optical axis LA of continuous laser light L by the actuator 18 (optical system movement unit 52), according to states when a laser support light LS is put on and after the laser support light LS is put on (when the laser support light LS is maintained).

That is, as illustrated in FIG. 9, when the laser support light LS is put on, the casing 17 is held at a position where the continuous laser light L is condensed at nearly a surface (lighting start region RS) of an electron emission unit 13a (metal structure 13). Meanwhile, as illustrated in FIG. 10, after the laser support light LS is put on (when the laser support light LS is maintained), the casing 17 is moved along the optical axis LA of the continuous laser light L by the actuator 18, such that a condensing position F of the continuous laser light L is separated from the metal structure 13 (lighting start region RS), with respect to the condensing position F when the laser support light LS is put on.

As such, the condensing position F of the continuous laser light L can be easily separated from the metal structure 13 (lighting start region RS), with a simple configuration in which the casing 17 including the optical system 3 is moved by the actuator 18 (optical system movement unit 52).

In the second embodiment, the casing 17 is moved in the direction of the optical axis LA of the continuous laser light L by the actuator 18. However, if the condensing position F of the continuous laser light L after the laser support light LS is put on (when the laser support light LS is maintained) is positioned separate from the metal structure 13 (lighting start region RS) with respect to the condensing position F of the continuous laser light L when the laser support light LS is put on, a movement direction of the casing 17 may be a direction (for example, a direction intersecting with the optical axis LA of the continuous laser light L) different from the direction of the optical axis LA of the continuous laser light L.

Third Embodiment

Figure 11:
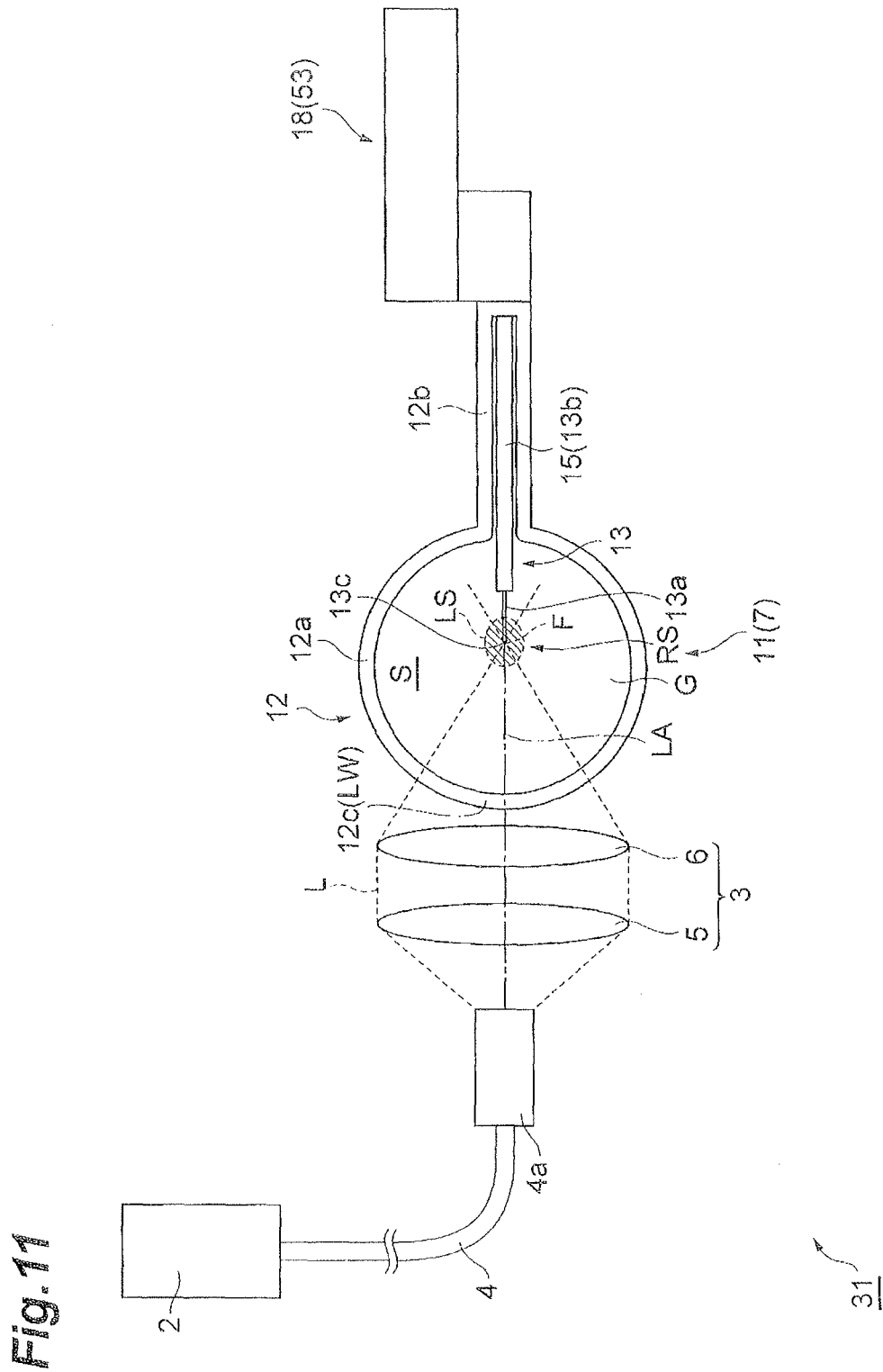
Figure 12:
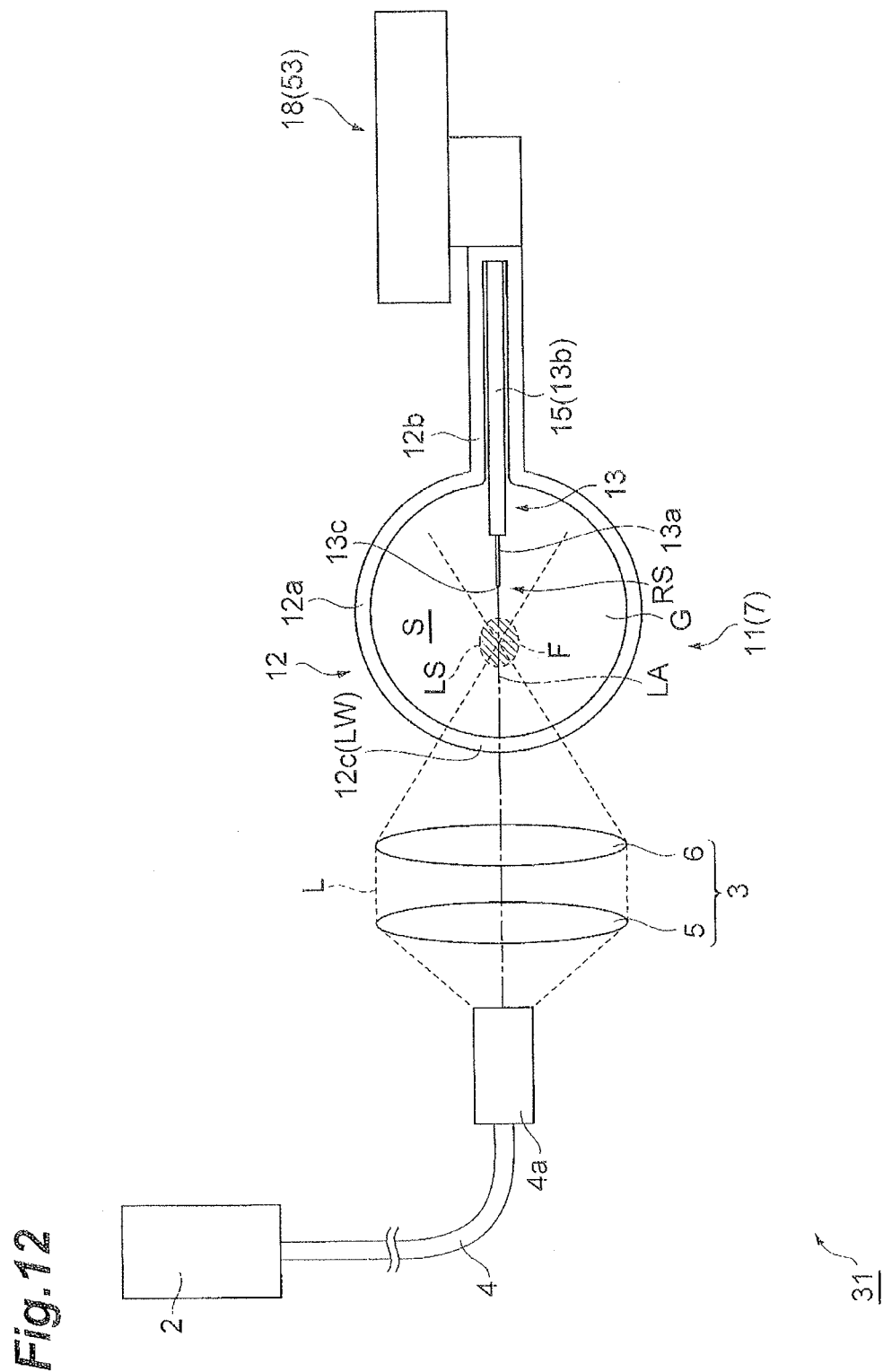
FIG. 12 is a diagram illustrating a state of the light source device illustrated in FIG. 11 after the laser support light is put on (when the laser support light is maintained).

FIGS. 11 and 12 are diagrams illustrating a light source device according to a third embodiment of the present invention. Hereinafter, the light source device according to the third embodiment will be described. However, description overlapped to the description of the first and second embodiments is omitted. As illustrated in FIGS. 11 and 12, in a light source device 31, a light emission sealing body 11 is held by an actuator 18 (light emission sealing body movement unit 53) and is moved in a direction of an optical axis LA of a continuous laser light L by the actuator 18 (light emission sealing body movement unit 53) functioning as a condensing position movement unit, according to states when a laser support light LS is put on and after the laser support light LS is put on (when the laser support light LS is maintained).

That is, as illustrated in FIG. 11, when the laser support light LS is put on, the light emission sealing body 11 is held at a position where the continuous laser light L is condensed at nearly a surface (lighting start region RS) of an electron emission unit 13a (metal structure 13). Meanwhile, as illustrated in FIG. 12, after the laser support light LS is put on (when the laser support light LS is maintained), the light emission sealing body 11 is moved along an optical axis LA of the continuous laser light L by the actuator 18, such that a condensing position F of the continuous laser light L is separated from the metal structure 13 (lighting start region RS), with respect to the condensing position F when the laser support light LS is put on.

As such, the condensing position F of the continuous laser light L can be easily separated from the metal structure 13 (lighting start region RS), with a simple configuration in which the light emission sealing body 11 is moved by the actuator 18 (light emission sealing body movement unit 53).

In the third embodiment, the light emission sealing body 11 is moved in the direction of the optical axis LA of the continuous laser light L by the actuator 18. However, if the condensing position F of the continuous laser light L after the laser support light LS is put on (when the laser support light LS is maintained) is positioned separate from the metal structure 13 (lighting start region RS) with respect to the condensing position F of the continuous laser light L when the laser support light LS is put on, a movement direction of the light emission sealing body 11 may be a direction (for example, a direction intersecting with the optical axis LA of the continuous laser light L) different from the direction of the optical axis LA of the continuous laser light L.

Fourth Embodiment

Figure 13:
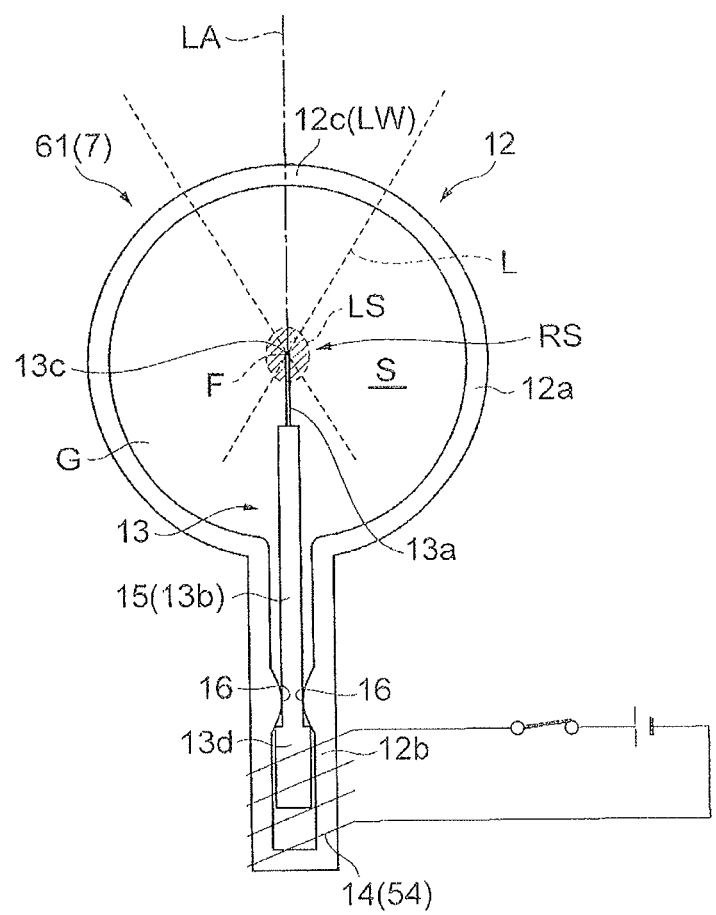
Figure 14:
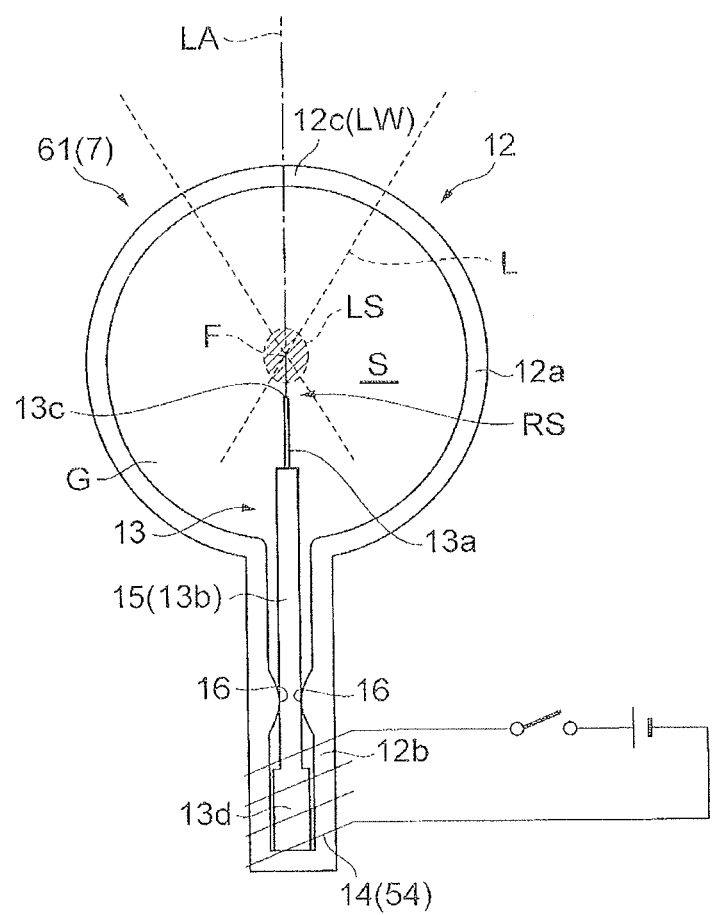
FIG. 14 is a diagram illustrating a state of the light emission sealing body illustrated in FIG. 13 after the laser support light is put on (when the laser support light is maintained).

FIGS. 13 and 14 are diagrams illustrating a light emission sealing body configuring a light source device according to a fourth embodiment of the present invention. Hereinafter, the light emission sealing body configuring the light source device according to the fourth embodiment will be described. However, description overlapped to the description of the first to third embodiments is omitted.

As illustrated in FIGS. 13 and 14, a light emission sealing body 61 (light source 7) has a small diameter portion 16 that holds a road-shaped member 15 to be a support unit 13b. The small diameter portion 16 is provided using a part of an inner wall of a protrusion portion 12b and an inner diameter of the protrusion portion 12b is reduced to be smaller than an inner diameter of the other portion, such that the small diameter portion 16 contacts the rod-shaped member 15. The small diameter portion 16 contacts only a circumferential surface of the rod-shaped member 15 and is not fusion-bonded to the rod-shaped member 15. In addition, the small diameter portion 16 may be provided to be closer to a base end side (lower side in the drawings) than a position exemplified in FIGS. 13 and 14 and may be provided to be closer to a leading end side (upper side in the drawings). In addition, multiple small diameter portions 16 may be provided.

In addition, the metal structure 13 (electron emission structure) is provided with a large diameter portion 13d provided to contact the small diameter portion 16 in an end portion of the rod-shaped member 15 communicating with the small diameter portion 16. A coil 14 (electron emission structure movement unit 54) is provided as a condensing position movement unit at an outer wall side of the protrusion portion 12b to correspond to a position of the large diameter portion 13d. The coil 14 (electron emission structure movement unit 54) applies magnetic force to the rod-shaped member 15, such that the large diameter portion 13d of the side of the rod-shaped member 15 contacts the small diameter portion 16 of the side of the protrusion portion 12b. As a result, the metal structure 13 is moved in a direction of an optical axis LA of a continuous laser light L according to states when a laser support light LS is put on and after the laser support light LS is put on (when the laser support light LS is maintained).

That is, as illustrated in FIG. 13, when the laser support light LS is put on, the metal structure 13 is held at a position where the continuous laser light L is condensed at nearly a surface (lighting start region RS) of an electron emission unit 13a (metal structure 13) by the magnetic force applied from the coil 14 (electron emission structure movement unit 54). Meanwhile, as illustrated in FIG. 14, after the laser support light LS is put on (when the laser support light LS is maintained), the application of the magnetic force from the coil 14 is stopped. As a result, the metal structure 13 is moved along the optical axis LA of the continuous laser light L, such that a condensing position F of the continuous laser light L is separated from the metal structure 13 (lighting start region RS) with respect to the condensing position F when the laser support light LS is put on.

As such, if the light emission sealing body 61 is used, the metal structure 13 is moved by the coil 14 (electron emission structure movement unit 54), so that the condensing position F of the continuous laser light L can be easily separated from the metal structure 13 (lighting start region RS). In this case, because the movement of the condensing position F of the continuous laser light L does not require the movement or the adjustment of an optical system 3 and a bulb 12, an optical condition in a radiation path of the continuous laser light L can be maintained constantly and the condensing position of the continuous laser light L can be maintained at an appropriate position.

The light emission sealing body 61 can take another aspect. For example, in a light emission sealing body 71 (light source 7) illustrated in FIGS. 15A and 15B, a spacer member 19 fitted into an inner wall of the protrusion portion 12b such that the rod-shaped member 15 is inserted and the large diameter portion 13d provided to contact the small diameter portion 16 in the end portion of the rod-shaped member 15 communicating with the spacer member 19 are provided. Even in this case, the coil 14 (electron emission structure movement unit 54) is provided at the side of the outer wall of the protrusion portion 12b to correspond to the position of the large diameter portion 13d and applies the magnetic force to the rod-shaped member 15, such that the large diameter portion 13d of the side of the rod-shaped member 15 contacts the spacer member 19.

Even in this case, similar to the fourth embodiment, the coil 14 (electron emission structure movement unit 54) applies the magnetic force to the rod-shaped member 15, so that the metal structure 13 moves in the direction of the optical axis LA of the continuous laser light L, according to states when the laser support light LS is put on (FIG. 15A)

and after the laser support light LS is put on (when the laser support light LS is maintained) (FIG. 15B).

Fifth Embodiment

Figure 16:
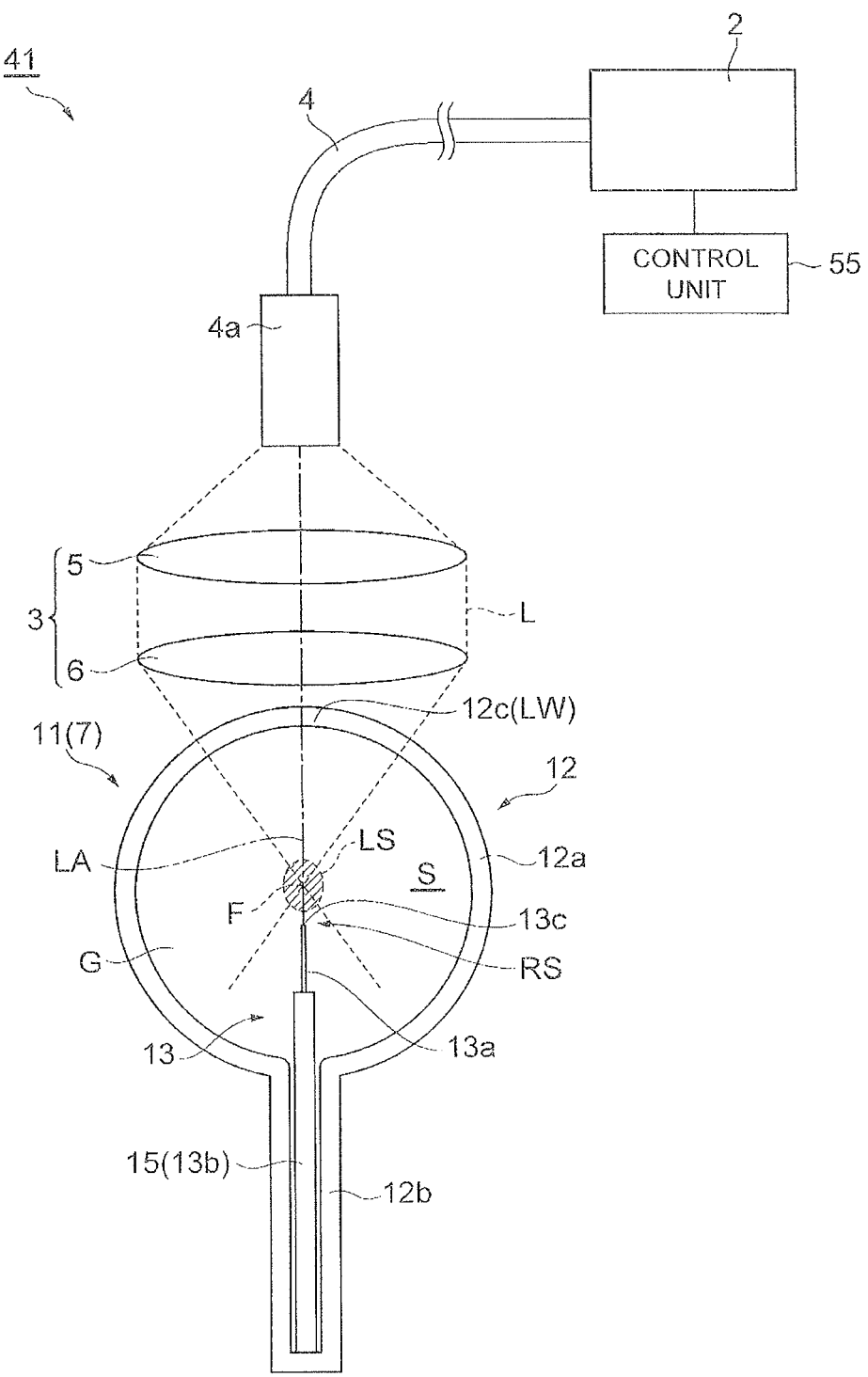
FIG. 16 is a diagram illustrating a light source device according to a fifth embodiment of the present invention.

FIG. 16 is a diagram illustrating a light source device according to a fifth embodiment of the present invention. Hereinafter, the light source device according to the fifth embodiment will be described. However, description overlapped to the description of the first to fourth embodiments is omitted. As illustrated in FIG. 16, a light source device 41 includes a control unit 55 that adjusts emission energy of a continuous laser light L emitted from a laser unit 2. In addition, in the light source device 41, an optical system 3 condenses the continuous laser light L at a position separated from a surface (lighting start region RS) of an electron emission unit 13a (metal structure 13). That is, the defocused continuous laser light L is radiated to the surface (lighting start region RS) of the electron emission unit 13a (metal structure 13) at all times.

Figure 17A:
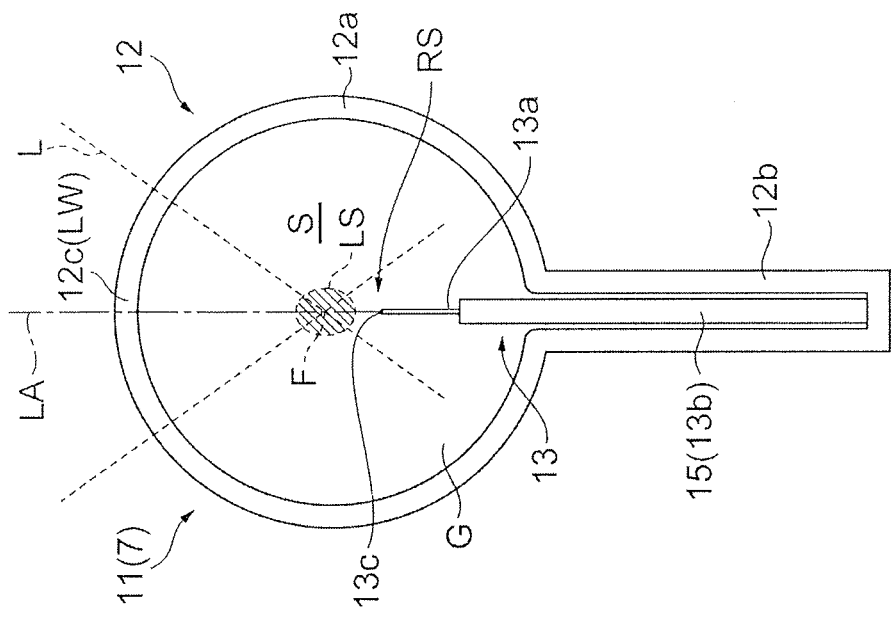
FIGS. 17A and 17B are diagrams illustrating functions of the light source device illustrated in FIG. 16 and, specifically.
Figure 17B:
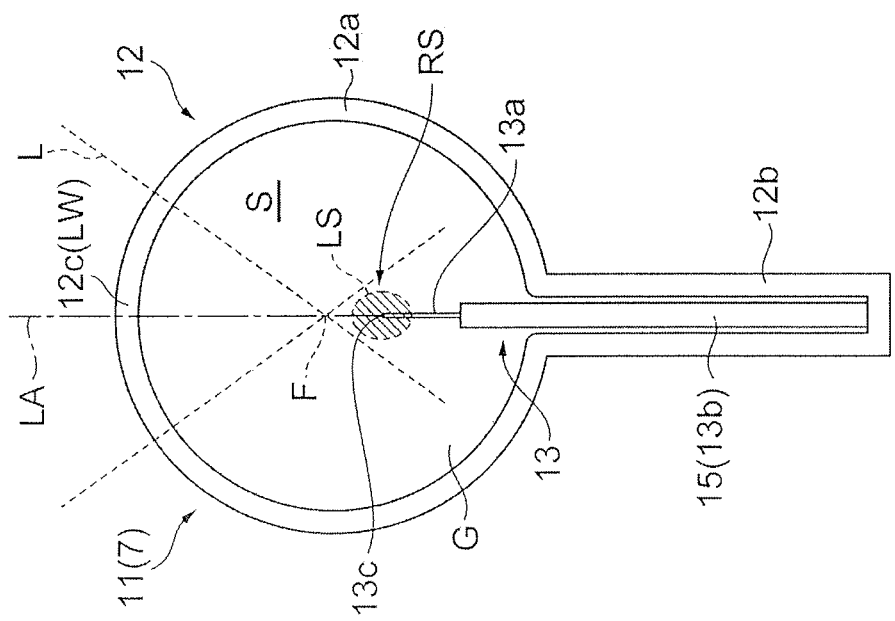

FIGS. 17A and 17B are diagrams illustrating functions of the control unit 5. As illustrated in FIG. 17A, when a laser support light LS is put on, the control unit 55 sets a condensing position F of the continuous laser light L to a position separated from the surface (lighting start region RS) of the electron emission unit 13a (metal structure 13) and sets emission energy of the continuous laser light L emitted from the laser unit 2, such that an energy density of the continuous laser light L on the surface (lighting start region RS) of the electron emission unit 13a (metal structure 13) is a degree (for example, about 530 kW/cm$^2$) where the laser support light LS can be put on. As a result, the continuous laser light L radiated to the surface (lighting start region RS) of the electron emission unit 13a (metal structure 13) can light the laser support light LS in a defocused state.

Meanwhile, as illustrated in FIG. 17B, after the laser support light LS is put on (when the laser support light LS is maintained), the control unit 55 sets the emission energy of the continuous laser light L emitted from the laser unit 2 to be lower than the emission energy of the continuous laser light L when the laser support light LS is put on, in a state in which the condensing position F of the continuous laser light L is maintained at a position (position of FIG. 17A) when the laser support light LS is put on. Specifically, the control unit 55 sets the energy density of the continuous laser light L on the surface (lighting start region RS) of the electron emission unit 13a (metal structure 13) to about 260 kW/cm$^2$, from about 530 kW/cm$^2$ when the laser support light LS is put on. As a result, because a region having energy capable of maintaining the laser support light LS can be set to only the vicinity of the condensing position F of the continuous laser light L, the laser support light LS can be maintained at the position separated from the metal structure 13 (lighting start region RS).

As such, in the light source device 41, the emission energy of the continuous laser light L is adjusted by the control unit 55 while the continuous laser light L emitted from the laser unit 2 is condensed at the position separated from the surface (lighting start region RS) of the metal structure 13. That is, in the light source device 41, the defocused continuous laser light L is radiated to the surface (lighting start region RS) of the metal structure 13 at all times and the energy density of the continuous laser light L on the surface of the electron emission unit 13a (metal structure 13) when the laser support light LS is maintained is set to be lower than the energy density of the continuous laser light L when the laser support light LS is put on. For this reason, the surface of the metal structure 13 can be suppressed from being locally sputtered. Therefore, a long life of the metal structure 13 can be realized. In addition, in the light source device 41, because it is unnecessary to mechanically move the condensing position F of the continuous laser light L, the condensing position of the continuous laser light L can be maintained at an appropriate position and because a device to move the optical system 3 or the light emission sealing body 11 is unnecessary, the light source device can be miniaturized. As described above, the continuous laser light L may be radiated from a direction in which an optical axis LA of the continuous laser light L and an axis of an extension direction of the metal structure 13 are in the same axis and may be radiated from a direction in which the optical axis LA of the continuous laser light L and the axis of the extension direction of the metal structure 13 intersect with each other.

Sixth Embodiment

Figure 18:
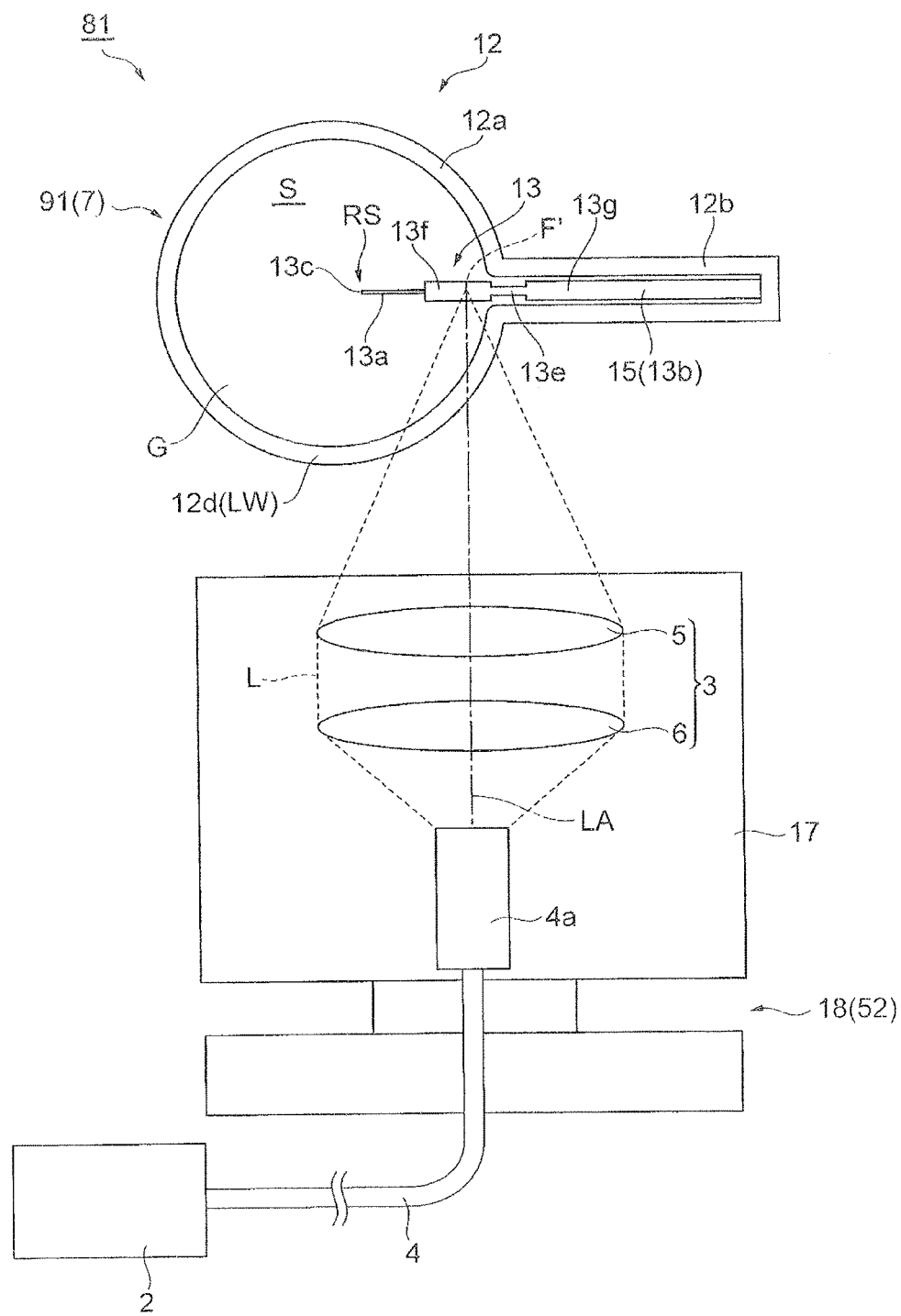
Figure 19:
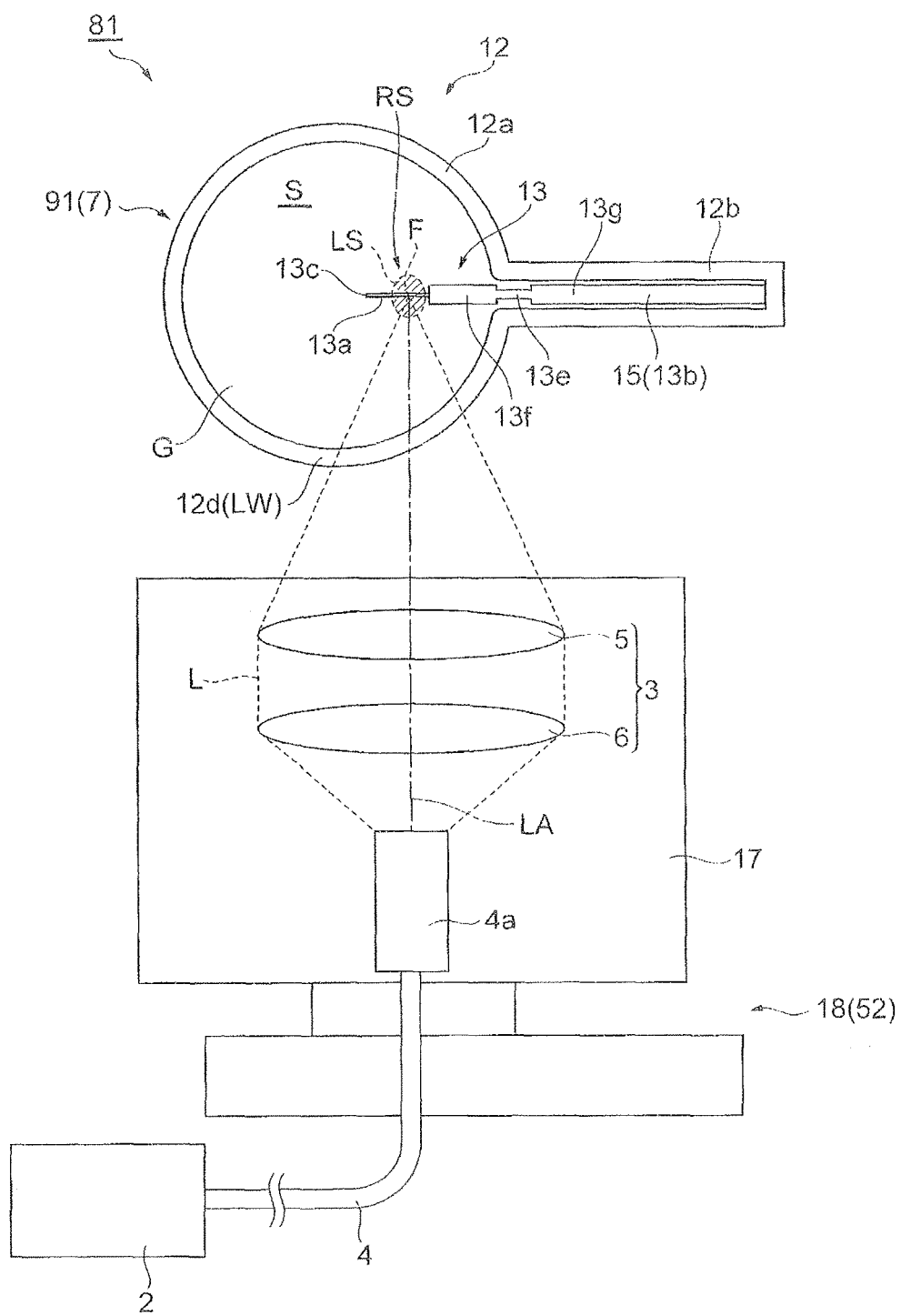
Figure 20:
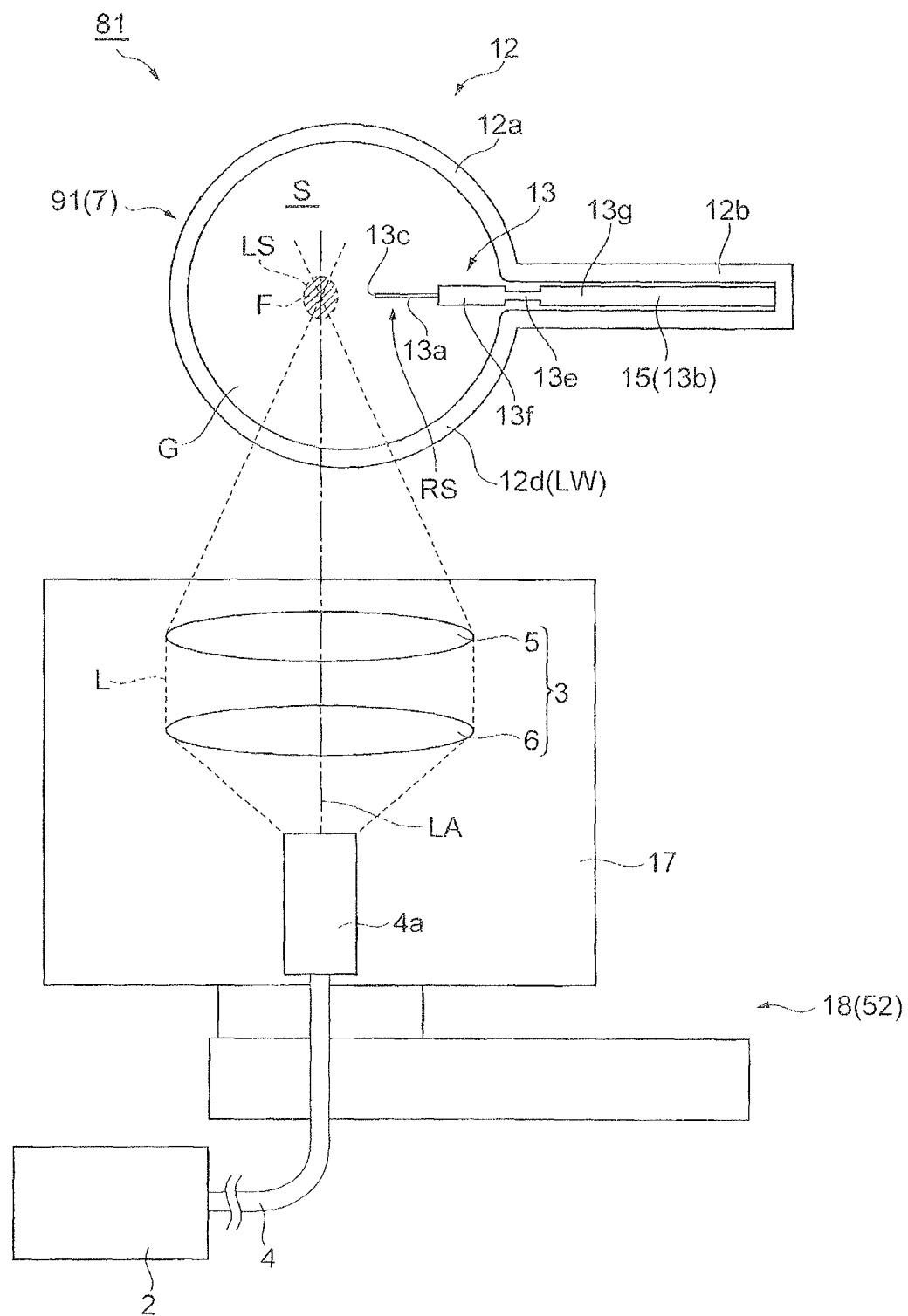
FIG. 20 is a diagram illustrating a state of the light source device illustrated in FIG. 18 after the laser support light is put on (when the laser support light is maintained).

FIGS. 18 to 20 are diagrams illustrating a light source device according to a sixth embodiment of the present invention. Hereinafter, the light source device according to the sixth embodiment will be described. However, description overlapped to the description of the first to fifth embodiments is omitted.

As illustrated in FIGS. 18 to 20, in a light source device 81, a continuous laser light L is radiated to a light emission sealing body 91 (light source 7), from a direction in which an optical axis LA of the continuous laser light L and an axis of an extension direction of a metal structure 13 intersect with each other. More specifically, the continuous laser light L is radiated from a direction in which the optical axis LA of the continuous laser light L and the axis of the extension direction of the metal structure 13 are nearly orthogonal to each other and a side portion 12d positioned at a side with respect to the axis of the extension direction of the metal structure 13 in a bulb 12 (in particular, a spherical portion 12a) corresponds to an incidence portion (laser incidence window portion LW) of the continuous laser light L. In addition, in the light source device 81, an optical axis 3 condenses the continuous laser light L, such that a position of a direction of the optical axis LA of a condensing position F of the continuous laser light L be nearly a surface (lighting start region RS) of an electron emission unit 13a. In addition, a holding unit 13f holding the electron emission unit 13a and a reduced diameter portion 13e which is closer to a base end side than the holding unit 13f and has a diameter reduced to be narrower than the holding unit 13f and the base end side (base end portion 13g) of a rod-shaped member 15 (support unit 13b) are formed at a leading end side of the rod-shaped member 15 (support unit 13b) of the metal structure 13. The reduced diameter portion 13e is provided at a position corresponding to an end portion of the side of the spherical portion 12a in a protrusion portion 12b of the bulb 12.

In this embodiment, a casing 17 in which an optical system 3 and a head 4a of an optical fiber 4 are stored is held by an actuator 18 (optical system movement unit 52) functioning as a condensing position movement unit and is moved in the direction (direction along an axis of an extension direction of the metal structure 13) nearly orthogonal to the direction of the optical axis LA of the continuous laser light L by the actuator 18 (optical system movement unit 52), according to states before a laser support light LS is put on, when the laser support light LS is put on, and after the laser support light LS is put on (when the laser support light LS is maintained).

That is, before the laser support light LS is put on, as illustrated in FIG. 18, the casing 17 is held at a position where the continuous laser light L is radiated to the holding unit 13f of the rod-shaped member 15 (support unit 13b). At this time, because the holding unit 13f has a diameter larger than a diameter of the electron emission unit 13a, a surface of the holding unit 13f is positioned to be closer to the side of a laser incidence window portion LW than a surface of the electron emission unit 13a. Therefore, the continuous laser light L radiated to the holding unit 13f is condensed at an internal virtual condensing position F' of the holding unit 13f visibly and is radiated in a defocused state at an energy density of a degree where sputtering does not occur in nearly the surface of the holding unit 13f. When the laser support light LS is put on, as illustrated in FIG. 19, the casing 17 moves to a position where the continuous laser light L is radiated to the electron emission unit 13a. At this time, the condensing position F of the continuous laser light L is at nearly the surface (lighting start region RS) of the electron emission unit 13a. After the laser support light LS is put on (when the laser support light LS is maintained), as illustrated in FIG. 20, the casing 17 moves such that the condensing position F of the contiguous laser light L is separated from the electron emission unit 13a (metal structure 13 (lighting start region RS)) with respect to the condensing position F when the laser support light LS is put on and is positioned in a spatial region of an internal space S and is held. As a result, after the laser support light LS is put on (when the laser support light LS is maintained), the electron emission unit 13a (metal structure 13 (lighting start region RS)) and the laser support light LS can be separated from each other and the continuous laser light L can be avoided from being radiated to the electron emission unit 13a (metal structure 13 (lighting start region RS)). That is, an energy density of the continuous laser light L on the surface (lighting start region RS) of the electron emission unit 13a (metal structure 13) when the laser support light LS is maintained can be set to be lower than an energy density of the continuous laser light L on the surface (lighting start region RS) of the electron emission unit 13a (metal structure 13) when the laser support light LS is put on.

As such, in the light source device 81, the condensing position F of the continuous laser light L can be easily separated from the metal structure 13 (lighting start region RS) in a direction (direction along the axis of the extension direction of the metal structure 13) intersecting with the direction of the optical axis LA of the continuous laser light L, with a simple configuration in which the casing 17 including the optical system 3 is moved by the actuator 18 (optical system movement unit 52). As a result, the energy density of the continuous laser light L on the surface (lighting start region RS) of the electron emission unit 13a (metal structure 13) can be set to an energy density suitable for each state before the laser support light LS is put on, when the laser support light LS is put on, and after the laser support light LS is put on (when the laser support light LS is maintained).

In this embodiment, before the laser support light LS is put on, the continuous laser light L is radiated to the holding unit 13f of the rod-shaped member 15 (support unit 13b) in a defocused state at an energy density of a degree where sputtering does not occur, so that the holding unit 13f is heated without being sputtered. Accordingly, a temperature of the electron emission unit 13a (metal structure 13) also increases. The reduced diameter portion 13e is formed, so that a heat conduction path from the holding unit 13 to the side of the base end portion 13g is restricted. For this reason, heating of the electron emission unit 13a (metal structure 13) by radiation of the continuous laser light L can be performed more efficiently. Because the surface of the reduced diameter portion 13e is separated from an inner wall surface of the bulb 12 by reducing a diameter of a part of the rod-shaped member 15 (support unit 13b), the heat can be suppressed from being released from the reduced diameter portion 13e to the bulb 12. For this reason, electrons can be easily emitted from the electron emission unit 13a (metal structure 13) when the laser support light LS is put on thereafter and the laser support light LS can be easily put on. In this embodiment, because heating by the radiation of the continuous laser light L is performed, the rod-shaped member 15 (support unit 13b) is preferably formed of a metal having a high melting point such as molybdenum and tungsten, which can endure the heating.

When the laser support light LS is put on, the continuous laser light L can be radiated to the surface (lighting start region RS) of the electron emission unit 13a at an energy density sufficient for lighting the laser support light LS, so that the laser support light LS can be surely put on. After the laser support light LS is put on (when the laser support light LS is maintained), the continuous laser light L is radiated to the laser support light LS moved to the spatial region of the internal space S separated from the metal structure 13 (lighting start region RS), so that the laser support light LS is maintained. For this reason, sputtering of the metal structure 13 by the laser support light LS can be suppressed. Because the continuous laser light L is not radiated to the metal structure 13, sputtering of the metal structure 13 by the continuous laser light L can be suppressed. Therefore, because a long life of the light emission sealing body 11 (light source 7) can be realized by suppressing deterioration of the metal structure 13 and contamination of an inner wall of the bulb 12 by the sputtering, a sufficiently long life of the light source device can be realized.

Figure 21:
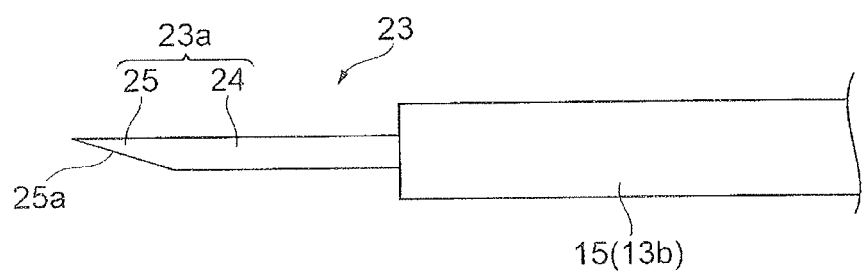
FIG. 21 is a main portion enlarged view illustrating a metal structure (electron emission structure) configuring a light source device according to a modification of the sixth embodiment.

In the sixth embodiment, the reduced diameter portion 13e is provided at the position corresponding to the end portion of the side of the spherical portion 12a in the protrusion portion 12b of the bulb 12. However, the reduced diameter portion 13e may be formed to enter into the spherical portion 12a and the reduced diameter portion 13e may extend continuously to the base end side of the rod-shaped member 14 (support unit 13b). In addition, in the sixth embodiment, the electron emission unit 13a is formed in a shape of a cylinder having a small diameter, for example. However, as illustrated in FIG. 21, an electron emission unit 23a may have a cylinder portion 24 having a small diameter that extends in an axial direction in which the rod-shaped member 15 (support unit 13b) extends and an inclined portion 25 that is provided at a leading end side of the cylinder portion 24. The inclined portion 25 is provided with an inclined surface 25a inclined to an axis of an extension direction of the cylinder portion 24 and the inclined surface 25a is also inclined to the optical axis LA of the continuous laser light L.

Figure 22A:
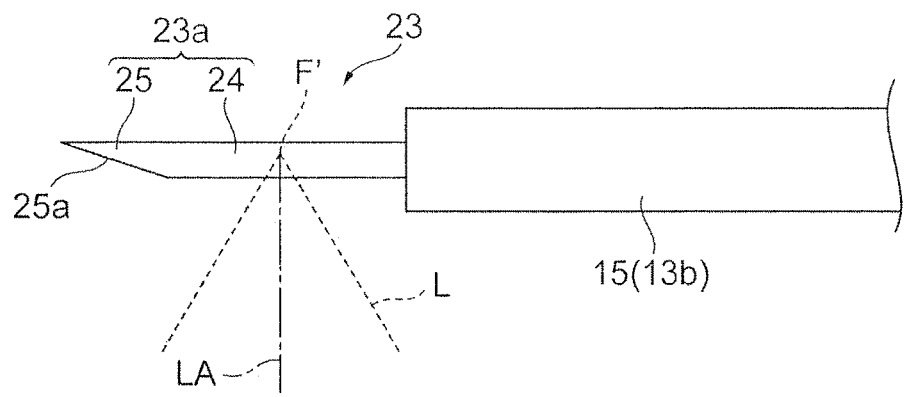
FIGS. 22A and 22B are main portion enlarged views illustrating a function of the metal structure (electron emission structure) illustrated in FIG. 21.
Figure 22B:
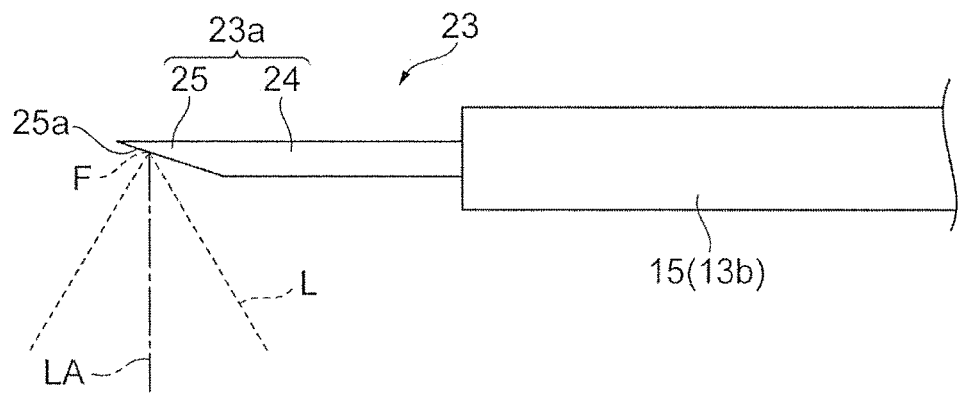

FIGS. 22A and 22B are main portion enlarged views illustrating a function of the electron emission unit 23a (metal structure 23). In general, when the laser support light LS is put on, the continuous laser light L is preferably condensed such that the condensing position F thereof is positioned on nearly the surface of the electron emission unit 23a. However, strict adjustment of the optical system 3 may be necessary. Even in the case in which the condensing position F of the continuous laser light L is not the position on nearly the surface of the electron emission unit 23a, if the energy density of the continuous laser light L on nearly the surface of the electron emission unit 23a is sufficiently high, the laser support light LS can be put on. However, a laser of a high output is necessary. Meanwhile, in this embodiment, there is a margin for position precision of the condensing position F of the continuous laser light L in the direction of the optical axis LA, without changing an output of the laser. First, as illustrated in FIG. 22A, the condensing position F of the continuous laser light L in the electron emission unit 23a is set as a virtual condensing position F' with position precision of a degree where the condensing position is surely confined within the cylinder portion 24 in the direction of the optical axis LA. Next, the casing 17 is moved by the actuator 18 in a direction along the axis of the extension direction of the cylinder 24, such that the virtual condensing position of the continuous laser light L moves from the side of the rod-shaped member 15 (support unit 13b) to the side of the inclined portion 25. As a result, as illustrated in FIG. 22B, because the condensing position F of the continuous laser light L can be surely set to any position on nearly the surface of the inclined surface 25a of the inclined portion 25 of the electron emission unit 23a, the laser support light LS can be put on.

As such, the electron emission unit 23a is provided with the inclined surface 25a to set the condensing position F of the continuous laser light L to any position on nearly the surface of the electron emission unit 23a, by moving the continuous laser light L when the laser support light LS is put on. For this reason, even though the optical system 3 is adjusted strictly, the condensing position F of the continuous laser light L can be surely set to any position on nearly the surface of the inclined surface 25a, as long as the virtual condensing position F' enters into the cylinder portion 24. Therefore, the laser support light LS can be put on. In this embodiment, the continuous laser light L on the surface of the cylinder portion 24 when the continuous laser light L is radiated to the cylinder portion 24 (FIG. 22A) is in defocused state at an energy density of a degree where sputtering does not occur. Therefore, the continuous laser light L is radiated to the cylinder portion 24, so that the electron emission unit 23a is heated, and an effect of facilitating lighting of the laser support light LS when the continuous laser light L is radiated to the inclined surface 25a thereafter is achieved.

In the sixth embodiment, the condensing position F of the continuous laser light L is moved by the actuator 18 (optical system movement unit 52). However, the condensing position F of the continuous laser light L may be moved by adjustment of the optical system 3. In addition, the condensing position F of the continuous laser light L may be moved by applying the light emission sealing body movement unit 53 described in the third embodiment and the condensing position F of the continuous laser light L may be moved by applying the electron emission structure movement unit 54 described in the fourth embodiment. Even in these cases, similar to the sixth embodiment, because a long life of the light emission sealing body 11 (light source 7) can be realized by suppressing deterioration of the metal structure 13 and contamination of an inner wall of the bulb 12 by the sputtering, a sufficiently long life of the light source device can be realized.

In the embodiments described above, the laser support light LS is moved to the optical axis LA of the continuous laser light L when the laser support light LS is put on or the axis of the movement direction of the continuous laser light L and is maintained. However, the laser support light LS may be moved to any position in the spatial space of the internal space S and may be maintained. In this case, it is possible to select a position where an influence of the laser support light LS on the metal structure can be further reduced or select a position suitable for extracting the laser support light LS from the light source 7, according to an external optical system. Even when the reduced diameter portion 13e is adopted in the embodiments other than the sixth embodiment, heating efficiency of the electron emission unit 13a (metal structure 13) can be improved and electrons can be easily emitted from the electron emission unit 13a (metal structure 13).

Seventh Embodiment

Figure 23:
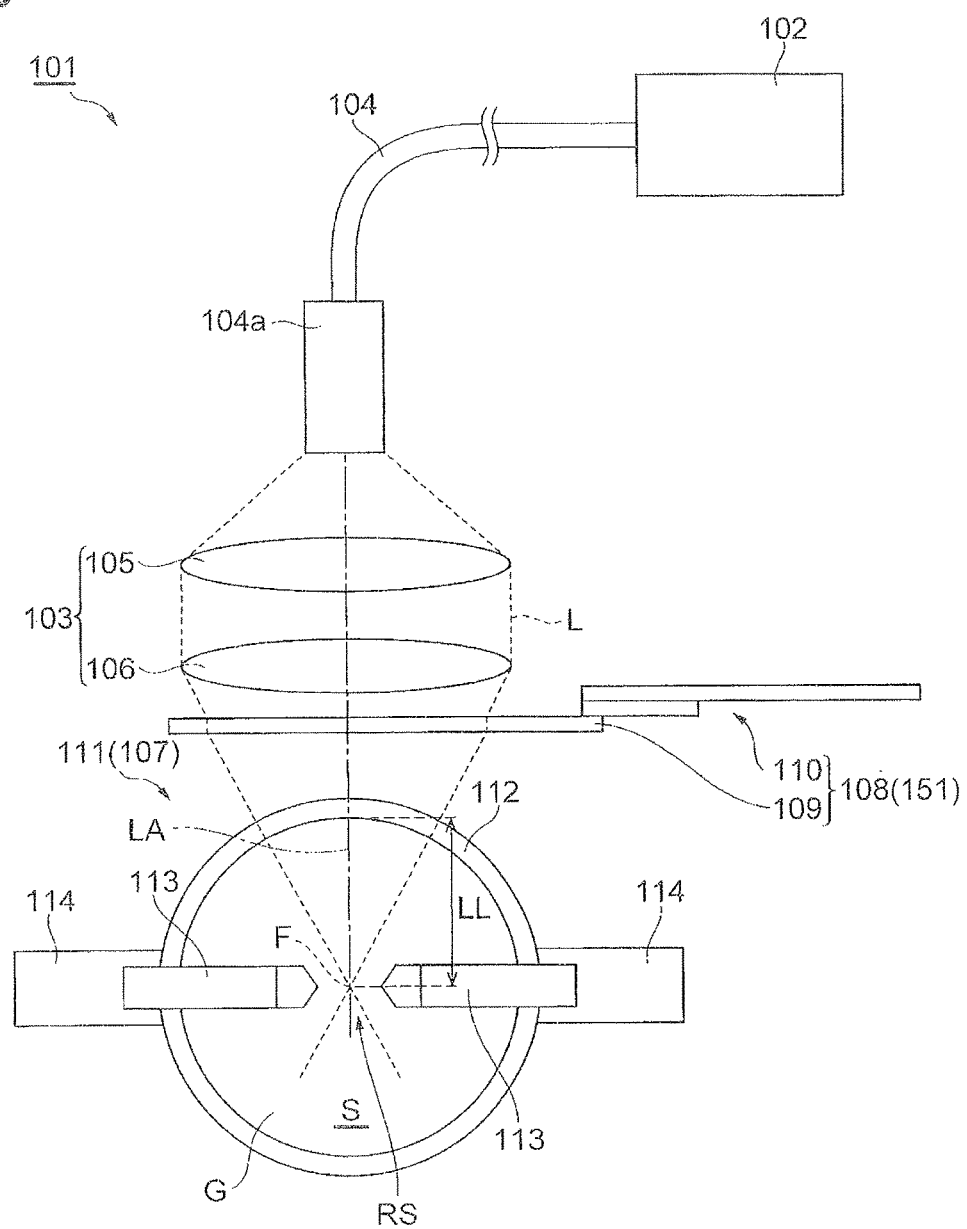
FIG. 23 is a diagram illustrating a light source device according to a seventh embodiment of the present invention.

FIG. 23 is a schematic diagram illustrating a light source device according to a seventh embodiment of the present invention. As illustrated in the same drawing, a light source device 101 includes a laser unit 102 that emits a laser light, an optical system 103 that guides the laser light L from the laser unit 102, and a light emission sealing body 111 (light source 107) that stores counter electrodes 113 and 113 facing each other. In the light source device 101, discharge is generated between the counter electrodes 113 and 113 and the laser light is radiated to a discharge region, so that a laser support light of a high brightness to be a plasma emission having a predetermined light emission region (lighting start region RS) including a condensing position F of the laser light L can be generated in the light emission sealing body 111 to be the light source 107. The laser support light can be used as a light source for semiconductor inspection or a light for spectroscopic measurement, for example.

The laser unit 102 is a laser diode, for example. As the laser unit 102, any one of a continuous laser and a pulsed laser may be used. However, in this embodiment, the continuous laser is used. The laser light L having a wavelength according to an absorption spectrum of light emission gas G, for example, a wavelength of 980 nm is emitted from the laser unit 102. An output of the laser light L is about 30 W, for example. The laser light L emitted from the laser unit 102 is guided to the optical system 103 by an optical fiber 104. The optical system 103 is an optical system that guides the laser light L from the laser unit 102 to a region between the counter electrodes 113 and 113. The optical system 103 is configured by two lenses 105 and 106, for example. After the laser light L emitted from a head 104a of the optical fiber 104 becomes parallel light by the lens 105, the laser light L is condensed toward the light emission sealing body 111 with an optical axis LA by the lens 106. A diameter of the condensed laser light L is a diameter of about 120 μm, for example.

More specifically, the light emission sealing body 111 includes a bulb (casing) 112 of which an internal space S is filled with the light emission gas G at a high pressure and the counter electrodes 113 and 113 facing each other in the internal space S. The bulb 112 is formed hollowly using glass, for example. As the light emission gas G, xenon gas is filled into the internal space S of the bulb 112 at a high pressure.

The counter electrodes 113 and 113 are formed in a shape of a rod using a metal having a high melting point such as tungsten and face each other at leading end sides thereof. A base end side of the counter electrode 113 penetrates a wall portion of the bulb 112, is extracted to the outside of the bulb 112, and is connected to a feeding member 114 connected to a power supply unit not illustrated in the drawings, so that power for inter-electrode discharge is supplied to the counter electrodes 113 and 113. The counter electrodes 113 and 113 may not directly penetrate the wall portion of the bulb 112 and conductive members electrically connected to the counter electrodes 113 and 113 may penetrate the wall portion of the bulb 112, may be extracted to the outside of the bulb 112, and may be connected to the feeding member 114.

In the light source device 101 described above, a high voltage is applied between the counter electrodes 113 and 113 through the feeding member 114, so that a discharge region is formed between the counter electrodes 113 and 113. By discharge, the light emission gas G in the internal space S is ionized and become plasma. The laser light L is radiated to the discharge region, so that the laser support light of the high brightness is put on in the lighting start region RS. By radiating the laser light L to the laser support light continuously, even though supplying of the power to the counter electrodes 113 and 113 is stopped, the laser support light is maintained by energy supply by the laser light L. After the laser light L is previously condensed at the discharge region, the discharge region may be formed between the counter electrodes 113 and 113. After the laser support light is put on, feeding to the counter electrodes 113 and 113 may be stopped and the feeding may be continuously performed.

The light source device 101 includes an optical path length adjustment unit 151 adjusting an optical path length of the laser light L as a condensing position movement unit. More specifically, the optical path length adjustment unit 151 adjusts an optical path length LL to be a length of the optical axis LA of the laser light L from the inner wall of the bulb 112 to the condensing position F, in the internal space S of the bulb 112. As the optical path length adjustment unit 151, the optical member 108 illustrated in FIG. 23 is used. The optical member 108 is configured by a plate-shaped transparent medium 109 in which a thickness (transmission length of the laser light L) of the direction of the optical axis LA of the laser light L is nearly uniform and an actuator 110 holding the transparent medium 109. The transparent medium 109 is formed of a material such as synthetic quartz glass, which has a refractive index higher than a refractive index of air (laser light radiation atmosphere outside the light emission sealing body 111). The transparent medium 109 held by the actuator 110 moves in a direction nearly orthogonal to the optical axis LA of the laser light L, according to each state when the laser support light LS is put on (FIG. 24) and after the laser support light LS is put on (when the laser support light LS is maintained) (FIG. 25).

Figure 24:
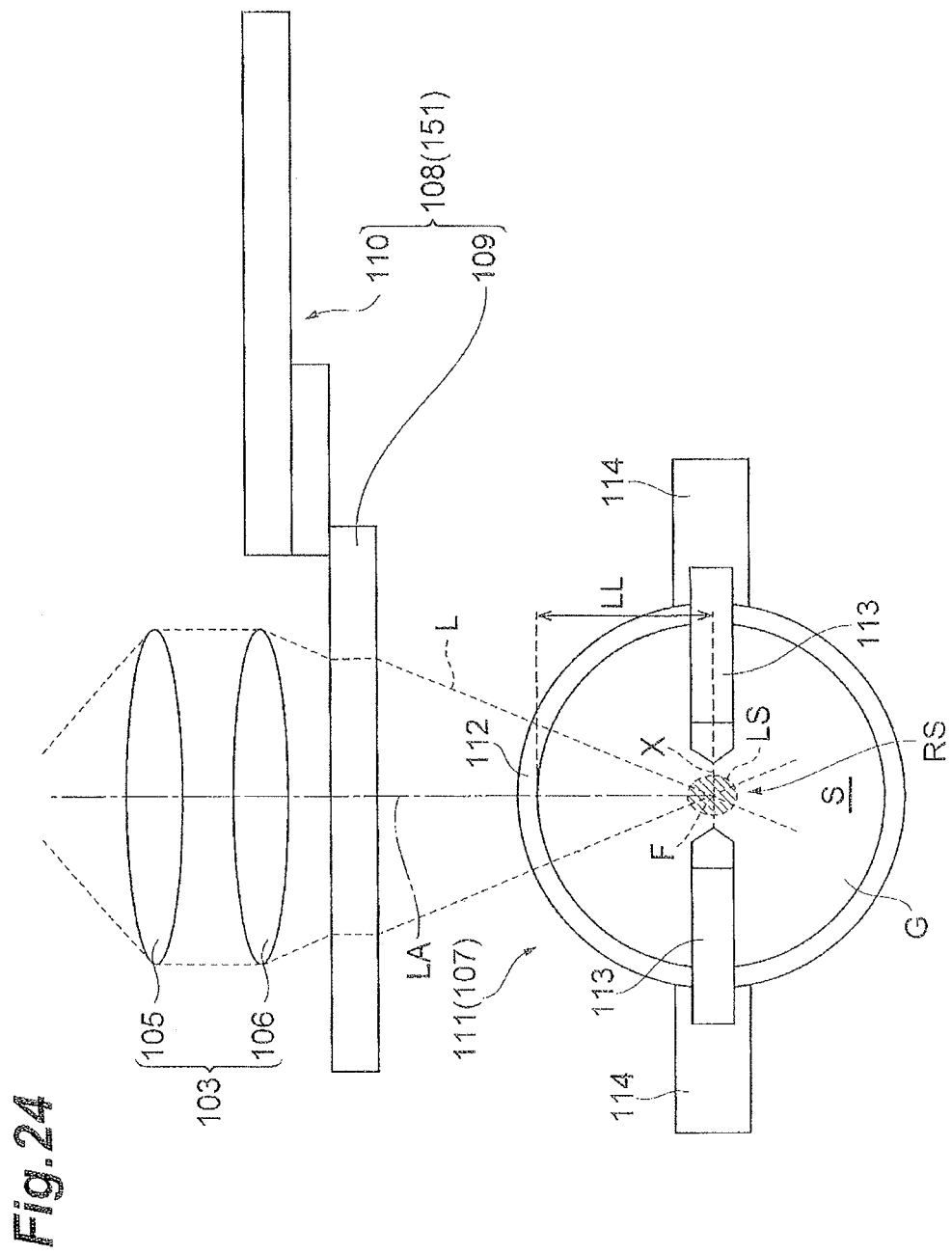

That is, first, as illustrated in FIG. 24, the transparent medium 109 is interposed between the optical system 103 and the light emission sealing body 111 and is disposed such that an entire region of a cross-sectional direction in the laser light L passes the transparent medium 109. At this time, the laser light L is condensed at a line X coupling pointed portions of the counter electrodes 113 and 113, that is, a discharge path having the highest discharge possibility in the discharge region between the counter electrodes 113 and 113. At this time, an energy density of the laser light L at the condensing position F (lighting start region RS) on the line X is about 260 kW/cm$^2$, for example. Thereby, the laser light L is radiated to the plasma generated in the discharge region (lighting start region RS) between the counter electrodes 113 and 113, so that the laser support light LS is put on.

Figure 25:
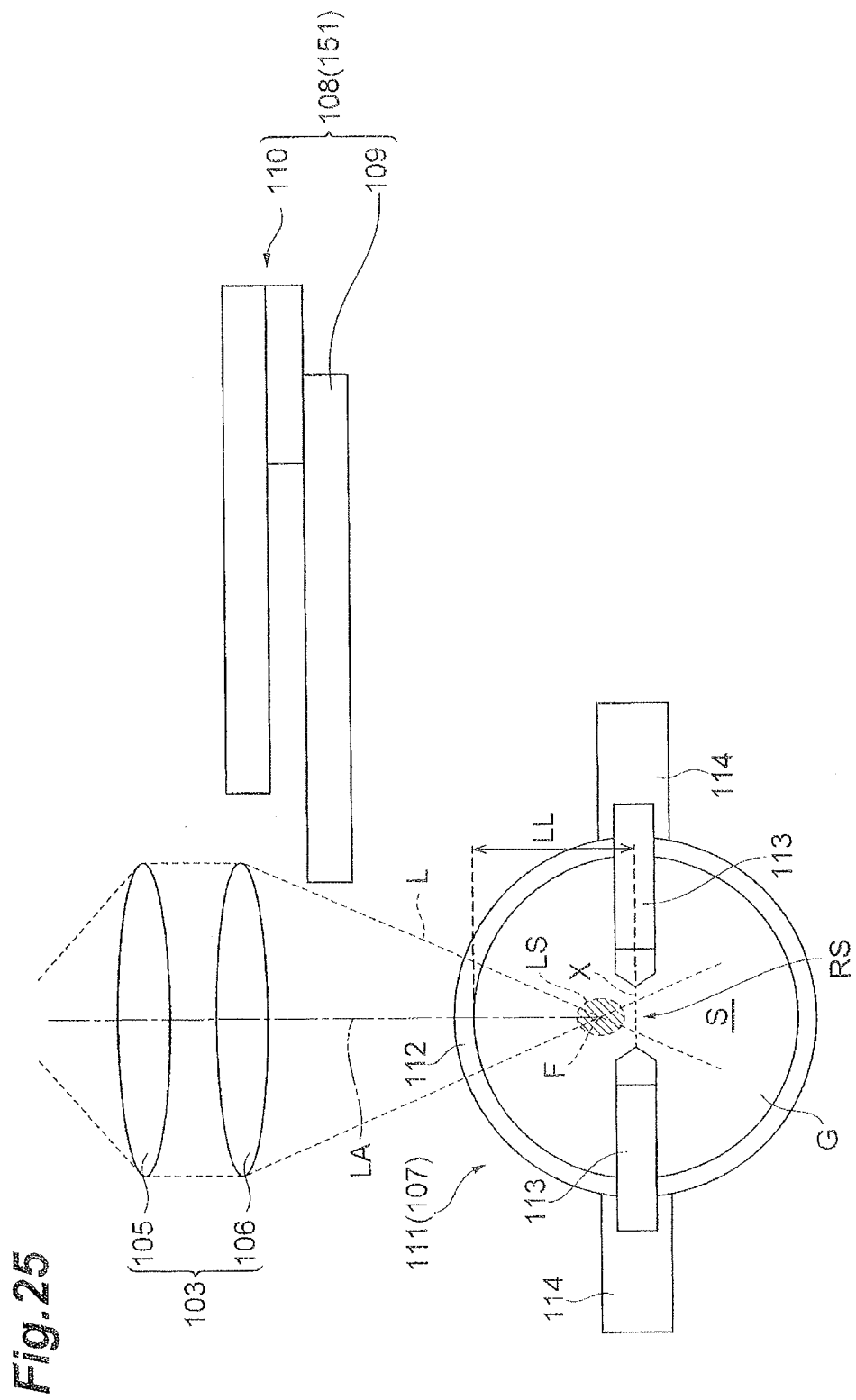

Next, after the laser support light LS is put on (when the laser support light LS is maintained), as illustrated in FIG. 25, the transparent medium 109 is moved by the actuator 110 not to be interposed between the optical system 103 and the light emission sealing body 111. At this time, because the condensing position F of the laser light L moves to a front side (upper side of FIG. 25) of the direction of the optical axis LA with respect to the condensing position F of the laser light L when the laser support light LS is put on, the energy density of the laser light L in (the lighting start region RS) on the line X gets lower than the energy density of the laser light L in (the lighting start region RS) on the line X when the laser support light LS is put on (when the laser support light LS is maintained) (FIG. 24).

In addition, when the condensing position F of the laser light L is separated from the counter electrodes 113 and 113 (lighting start region RS), the laser support light LS to be the plasma emission is also separated from the counter electrodes 113 and 113 (lighting start region RS). For this reason, sputtering of the counter electrodes 113 and 113 by the laser support light LS can be suppressed. In this way, deterioration of the counter electrodes 113 and 113 by the sputtering and obstruction of incidence of the laser light L and extraction of the laser support light LS by deposition of a sputtered material on an inner wall of the bulb 112 can be suppressed. For this reason, a decrease in light emission strength of the laser support light LS can be suppressed and a sufficiently long life of the light emission sealing body 111 and the light source device 101 can be realized.

In addition, the energy density of the laser light L at the condensing position F is decreased to a degree where the laser support light LS can be maintained, not the energy density when the laser support light LS is put on, or supplying of the power to the counter electrodes 113 and 113 is stopped, so that the sputtering of the counter electrodes 113 and 113 can be further suppressed. Therefore, a sufficiently long life of the light emission sealing body 111 and the light source device 101 can be realized.

The configuration of the optical member 108 (optical path length adjustment unit 151) can take another aspect. The optical member 108 may be configured by a light modulation element such as a spatial light modulation element. Instead of the transparent medium 109, the transparent medium 39 illustrated in FIG. 8(*a*) can be used. The transparent medium 39 has a plate shape in which one surface is inclined to another surface and the thickness (transmission length of the laser light L) of the direction of the optical axis LA of the laser light L continuously changes. Similar to the transparent medium 109, the transparent medium 39 is used in a state in which the transparent medium 39 is held by the actuator 110.

In the case of using the transparent medium 39, first, the transparent medium 39 is interposed between the optical system 103 and the light emission sealing body 111, such that the entire region of the cross-sectional direction in the laser light L passes the transparent medium 39, and the laser light L is condensed at the line X (lighting start region RS) coupling the pointed portions of the counter electrodes 113 and 113. As a result, the laser support light LS is put on in the discharge region (lighting start region RS) between the counter electrodes 113 and 113.

Next, after the laser support light LS is put on (when the laser support light LS is maintained), the transparent medium 39 is moved by the actuator 110 not to be interposed between the optical system 103 and the light emission sealing body 111. At this time, because one surface of the transparent medium 39 is inclined to another surface thereof, the thickness of the transparent medium 39 in an incidence region of the laser light L decreases gradually according to the movement of the transparent medium 39. For this reason, the condensing position F of the laser light L moves gradually to the front side (upper side of FIG. 24) of the direction of the optical axis LA according to the movement of the transparent medium 39. As a result, a region having an energy density sufficient for maintaining the laser support light LS moves gradually to the front side of the direction of the optical axis LA. Therefore, even though the condensing position F of the laser light L is moved to the front side of the direction of the optical axis LA after the laser support light LS is put on (when the laser support light LS is maintained), the movement of the condensing position F of the laser light L is continuous movement. For this reason, the laser support light LS can be maintained more surely.

Instead of the transparent medium 109, the transparent medium 49 illustrated in FIG. 8(b) can be used. The transparent medium 49 is formed by bonding the two members in which the thickness (transmission length of the laser light L) of the direction of the optical axis LA of the laser light L is different and is configured by bonding the end faces of the first transparent medium 49a having the thickness of about 4 mm, for example, and the second transparent medium 49b having the thickness of about 2 mm, for example.

In the case of using the transparent medium 49, first, the transparent medium 49 is interposed between the optical system 103 and the light emission sealing body 111, such that the entire region of the cross-sectional direction in the laser light L passes the first transparent medium 49a, and the laser light L is condensed at the line X (lighting start region RS) coupling the pointed portions of the counter electrodes 113 and 113. As a result, the laser support light LS is put on in the discharge region (lighting start region RS) between the counter electrodes 113 and 113.

Next, after the laser support light LS is put on (when the laser support light LS is maintained), the transparent medium 49 is moved by the actuator 110 not to be interposed between the optical system 103 and the light emission sealing body 111. At this time, because the transparent medium 49 is configured by the transparent mediums 49a and 49b of which the thickness is different, the thickness of the transparent medium 49 in an incidence region of the laser light L decreases stepwise according to the movement of the transparent medium 49. For this reason, the condensing position F of the laser light L moves stepwise to the front side (upper side of FIG. 24) of the direction of the optical axis LA according to the movement of the transparent medium 49. As a result, a region having an energy density sufficient for maintaining the laser support light LS moves stepwise to the front side of the direction of the optical axis LA. Therefore, even though the condensing position F of the laser light L is moved to the front side of the direction of the optical axis LA after the laser support light LS is put on (when the laser support light LS is maintained), the movement of the condensing position F of the laser light L is stepwise movement. For this reason, the laser support light LS can be maintained more surely.

In addition, in the seventh embodiment, the condensing position F of the laser light L after the laser support light LS is put on (when the laser support light LS is put on) is the position closer to the front side (upper side of FIG. 23) of the direction of the optical axis LA than the line X (lighting start region RS) coupling the pointed portions of the counter electrodes 113 and 113. However, the condensing position F of the laser light L after the laser support light LS is put on (when the laser support light LS is maintained) may be the position closer to the back side (lower side of FIG. 23) of the direction of the optical axis LA than the line X (lighting start region RS) coupling the pointed portions of the counter electrodes 113 and 113.

Figure 26:
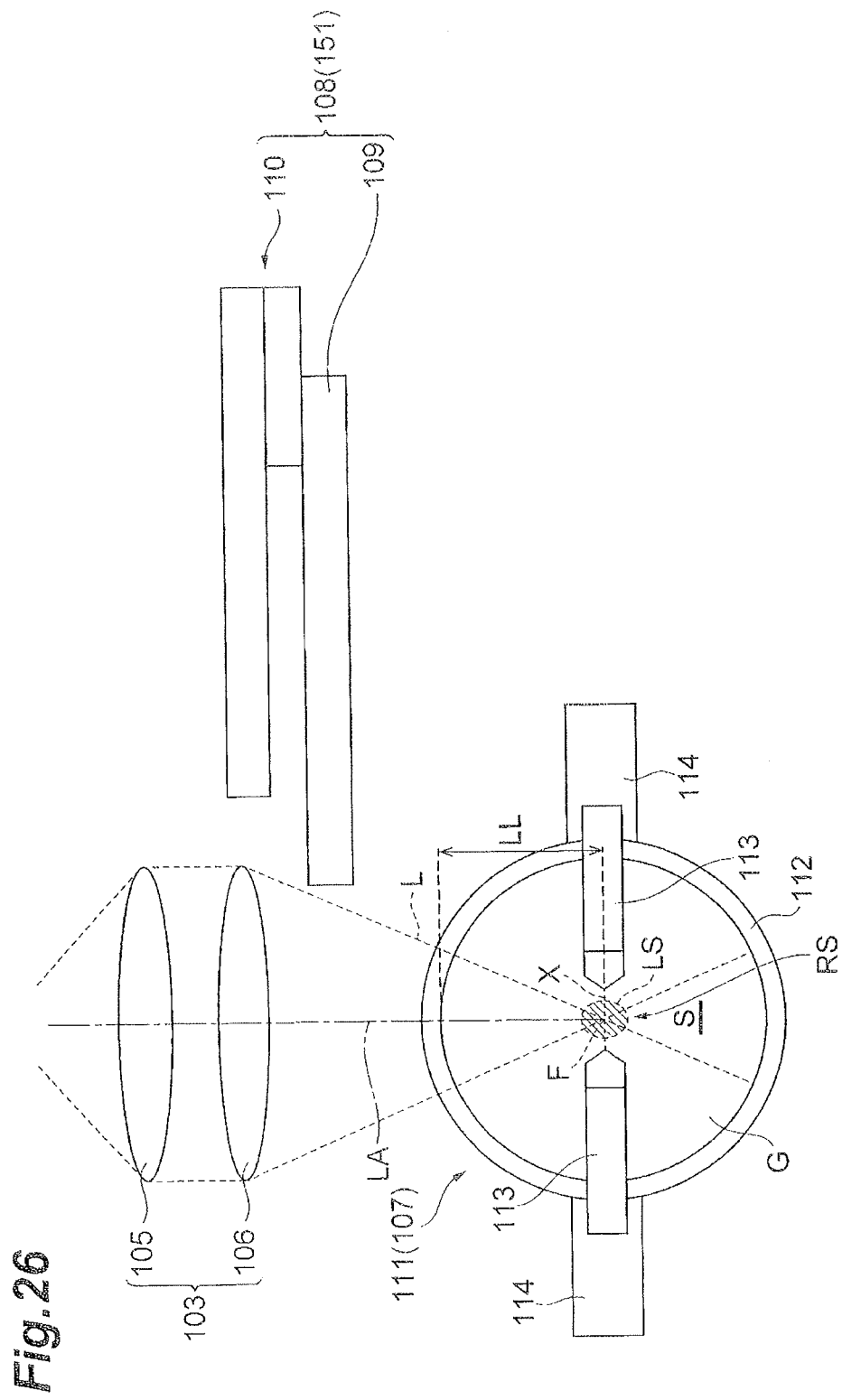
Figure 27:
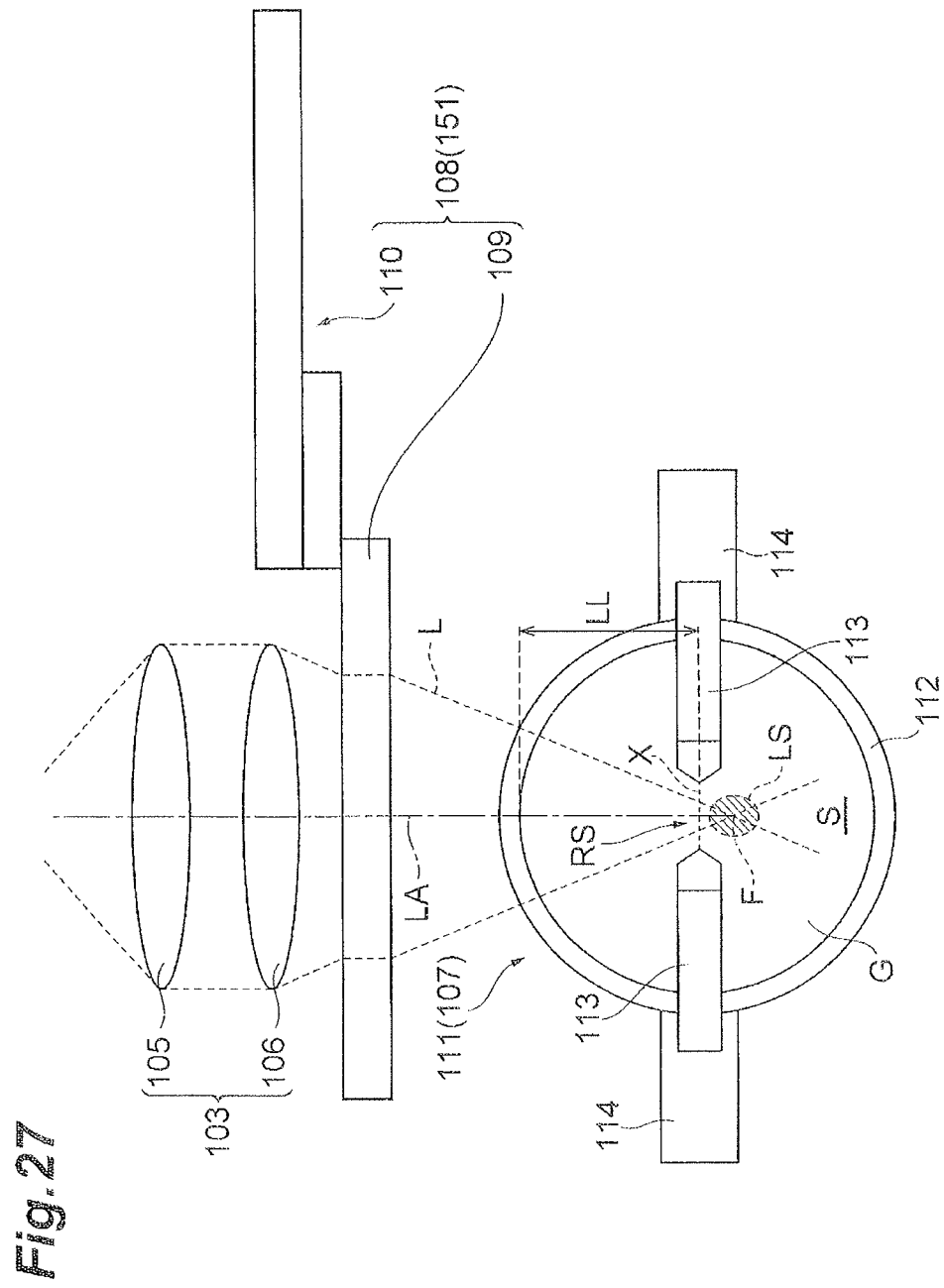

In this case, as illustrated in FIG. 26, the laser light L is condensed at the line X (lighting start region RS) coupling the pointed portions of the counter electrodes 113 and 113, in a state in which the transparent medium 109 is retracted from a region between the optical system 103 and the light emission sealing body 111 such that the entire region of the cross-sectional direction in the laser light L does not pass the transparent medium 109. Meanwhile, after the laser support light LS is put on (when the laser support light LS is maintained), as illustrated in FIG. 27, the transparent medium 109 is interposed between the optical system 103 and the light emission sealing body 111, such that the entire region of the cross-sectional direction in the laser light L passes the transparent medium 109. At this time, the condensing position F of the laser light L moves to the back side (lower side of FIG. 26) of the direction of the optical axis LA with respect to the condensing position F (lighting start region RS) of the laser light L when the laser support light LS is put on. Therefore, even in this case, the sputtering of the counter electrode 113 can be suppressed, similar to the seventh embodiment.

Eighth Embodiment

Figure 28:
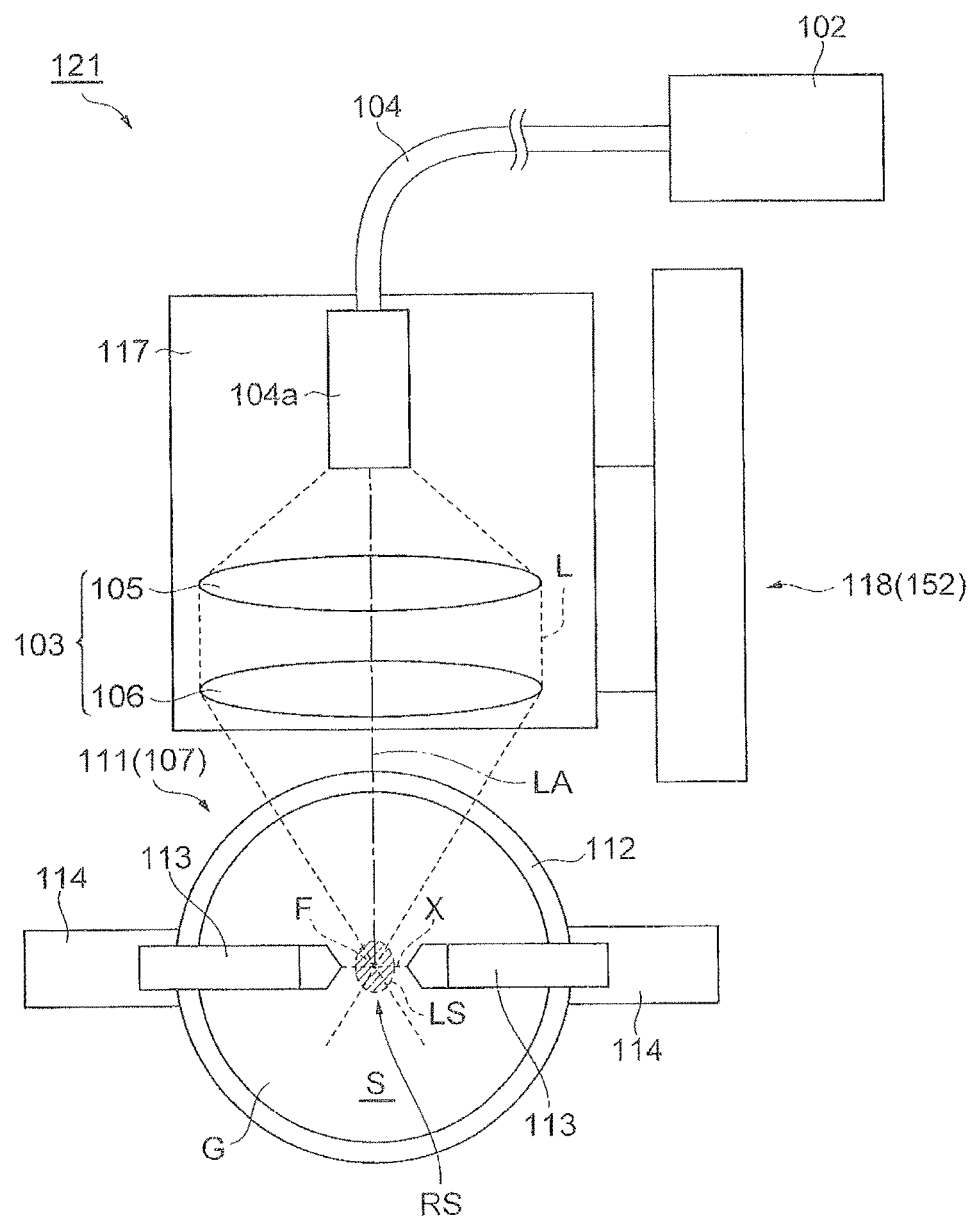
Figure 29:
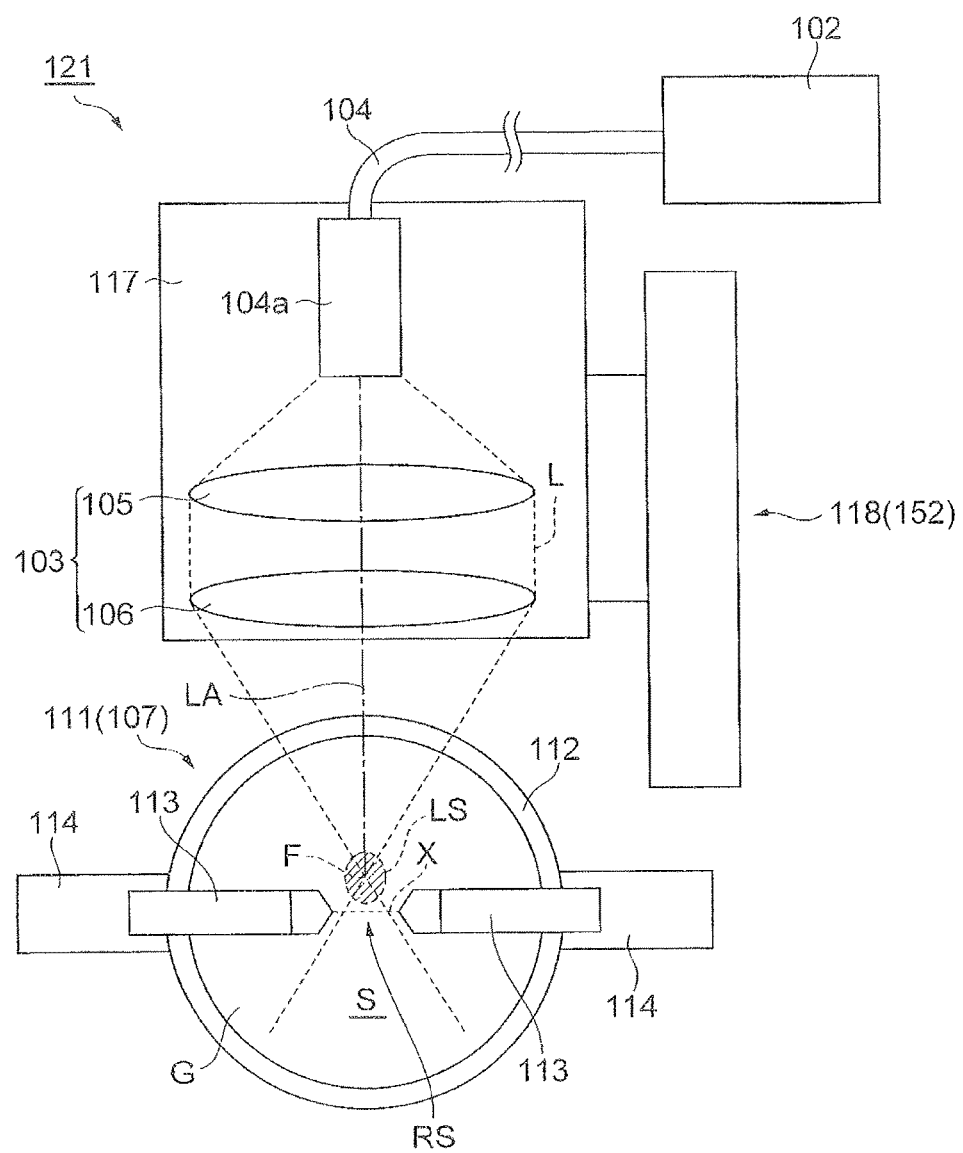

FIGS. 28 and 29 are diagrams illustrating a light source device according to an eighth embodiment of the present invention. Hereinafter, the light source device according to the eighth embodiment will be described. However, description overlapped to the description of the seventh embodiment is omitted. As illustrated in FIGS. 28 and 29, in a light source device 121, an optical system 103 and a head 104a of an optical fiber 104 are stored in a casing 117. The casing 117 is held by an actuator 118 (optical system movement unit 152) and moves in a direction of an optical axis LA, according to each state when a laser support light LS is put on (FIG. 28) and after the laser support light LS is put on (when the laser support light LS is maintained) (FIG. 29).

That is, first, as illustrated in FIG. 28, the casing 117 is held at a position where a laser light L is condensed at a line X (lighting start region RS) coupling pointed portions of counter electrodes 113 and 113. As a result, the laser support light LS is put on in a discharge region between the counter electrodes 113 and 113. Next, after the laser support light LS is put on (when the laser support light LS is maintained), as illustrated in FIG. 29, the casing 117 moves to a front side (upper side of FIG. 28) of a direction of the optical axis LA. As a result, because a condensing position F of the laser light L moves to the front side (upper side of FIG. 28) of the direction of the optical axis LA with respect to the condensing position F of the laser light L when the laser support light LS is put on, an energy density of the laser light L on the line X (lighting start region RS) coupling the pointed portions of the counter electrodes 113 and 113 after the laser support light LS is put on (when the laser support light LS is maintained) gets lower than an energy density of the laser light L on the line X (lighting start region RS) coupling the pointed portions of the counter electrodes 113 and 113 when the laser support light LS is put on.

As such, the energy density of the laser light L on the line X (lighting start region RS) coupling the pointed portions of the counter electrodes 113 and 113 can be changed by moving the condensing position F of the laser light L (separating the condensing position F from the (lighting start region RS) between the counter electrodes 113 and 113), with a simple configuration in which the casing 117 including the optical system 103 is moved by the actuator 18 (optical system movement unit 152). For this reason, sputtering of the counter electrodes 113 can be suppressed and a sufficiently long life of the light source device 121 can be realized.

In the eighth embodiment, the condensing position of the laser light L after the laser support light LS is put on (when the laser support light LS is maintained) is the position closer to the front side (upper side of FIG. 28) of the direction of the optical axis LA than the line X (lighting start region RS) coupling the pointed portions of the counter electrodes 113 and 113. However, the condensing position of the laser light L after the laser support light LS is put on (when the laser support light LS is maintained) is the position closer to the back side (lower side of FIG. 28) of the direction of the optical axis LA than the line X (lighting start region RS) coupling the pointed portions of the counter electrodes 113 and 113. That is, the holding position of the casing 117 after the laser support light LS is put on (when the laser support light LS is maintained) may be the back side (lower side of FIG. 28) of the direction of the optical axis LA with respect to the holding position of the casing 117 when the laser support light LS is put on.

Ninth Embodiment

Figure 30:
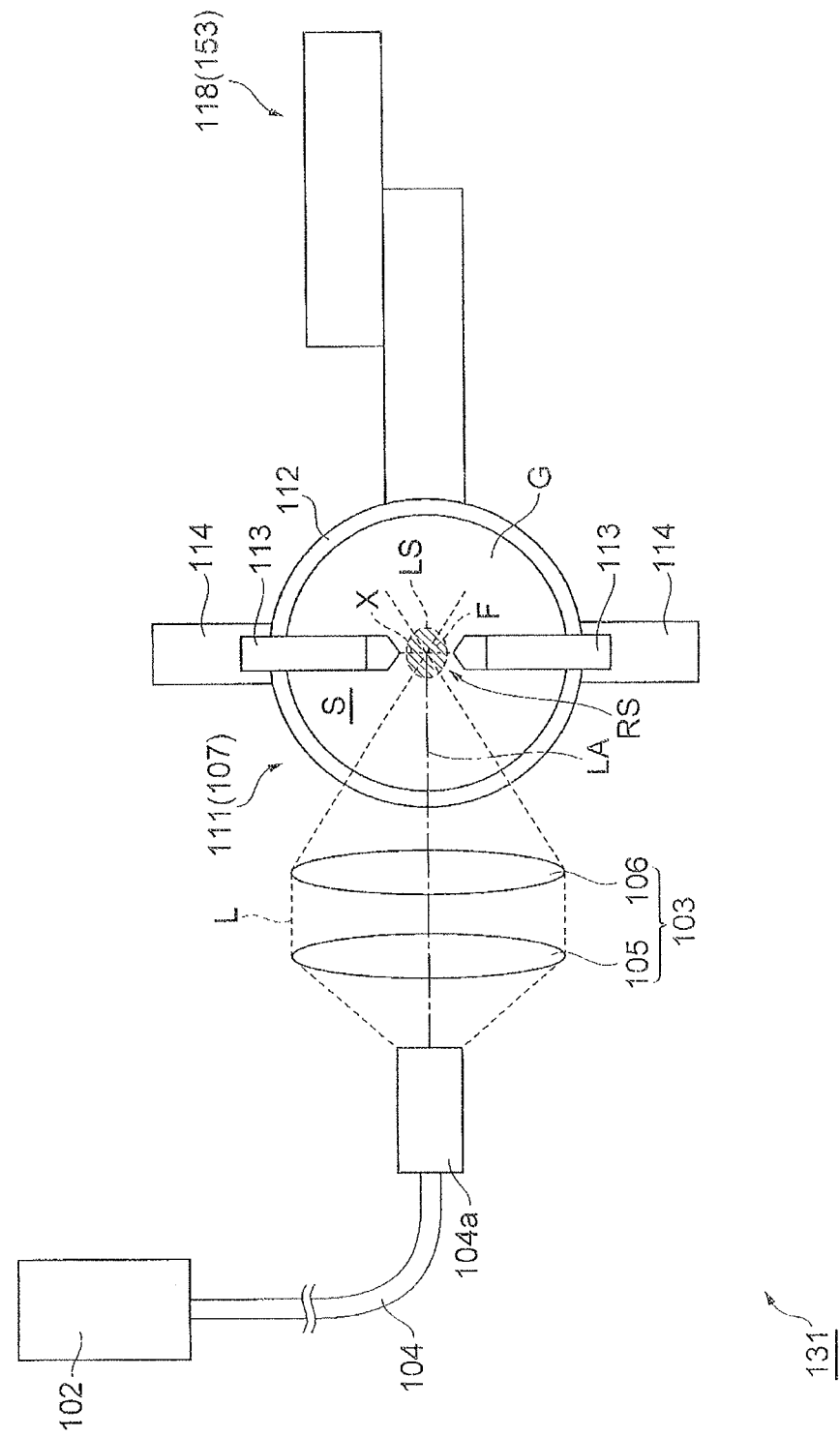
Figure 31:
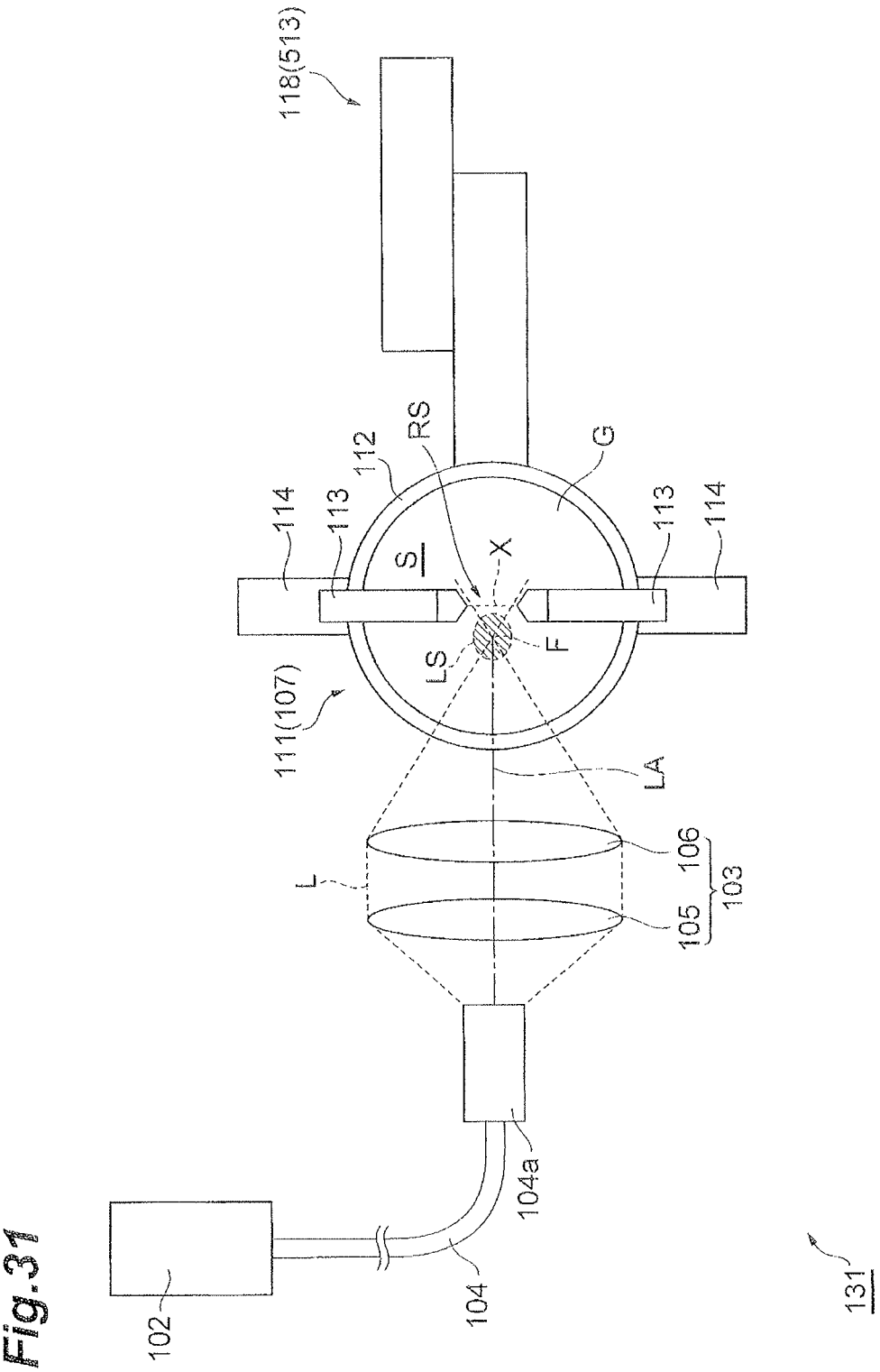

FIGS. 30 and 31 are diagrams illustrating a light source device according to a ninth embodiment of the present invention. Hereinafter, the light source device according to the ninth embodiment will be described. However, description overlapped to the description of the seventh and eighth embodiments is omitted. As illustrated in FIGS. 30 and 31, in a light source device 131, a light emission sealing body 111 is held by an actuator 118 (light emission sealing body movement unit 153) and moves in a direction of an optical axis LA, according to each state when a laser support light LS is put on (FIG. 30) and after the laser support light LS is put on (when the laser support light LS is maintained) (FIG. 31).

That is, first as illustrated in FIG. 30, the light emission sealing body 111 is held at a position where the laser light L is condensed at a line X (lighting start region RS) coupling pointed portions of counter electrodes 113 and 113. As a result, the laser support light LS is put on in a discharge region (lighting start region RS) between the counter electrodes 113 and 113. Next, after the laser support light LS is put on (when the laser support light LS is maintained), as illustrated in FIG. 31, the light emission sealing body 111 moves to a back side (right side of FIG. 30) of a direction of an optical axis LA. As a result, because a condensing position F of the laser light L moves to a front side (left side of FIG. 30) of the direction of the optical axis LA with respect to the condensing position F of the laser light L when the laser support light LS is put on, an energy density of the laser light L on the line X (lighting start region RS) coupling the pointed portions of the counter electrodes 113 and 113 after the laser support light LS is put on (when the laser support light LS is maintained) gets lower than an energy density of the laser light L on the line X (lighting start region RS) coupling the pointed portions of the counter electrodes 113 and 113 when the laser support light LS is put on.

As such, the energy density of the laser light L on the line X (lighting start region RS) coupling the pointed portions of the counter electrodes 113 and 113 can be changed by moving the condensing position F of the laser light L (separating the condensing position F from the (lighting start region RS) between the counter electrodes 113 and 113), with a simple configuration in which the light emission sealing body 111 is moved by the actuator 118 (light emission sealing body movement unit 153). For this reason, sputtering of the counter electrodes 113 can be suppressed and a sufficiently long life of the light source device 131 can be realized.

In the ninth embodiment, the condensing position F of the laser light L after the laser support light LS is put on (when the laser support light LS is maintained) is the position closer to the front side (left side of FIG. 30) of the direction of the optical axis LA than the line X (lighting start region RS) coupling the pointed portions of the counter electrodes 113 and 113. However, the condensing position F of the laser light L after the laser support light LS is put on (when the laser support light LS is maintained) may be the position closer to the back side (right side of FIG. 30) of the direction of the optical axis LA than the line X (lighting start region RS) coupling the pointed portions of the counter electrodes 113 and 113. That is, the holding position of the light emission sealing body 111 after the laser support light LS is put on (when the laser support light LS is maintained) may be the front side (left side of FIG. 30) of the direction of the optical axis LA with respect to the holding position of the light emission sealing body 111 when the laser support light LS is put on.

Tenth Embodiment

Figure 32:
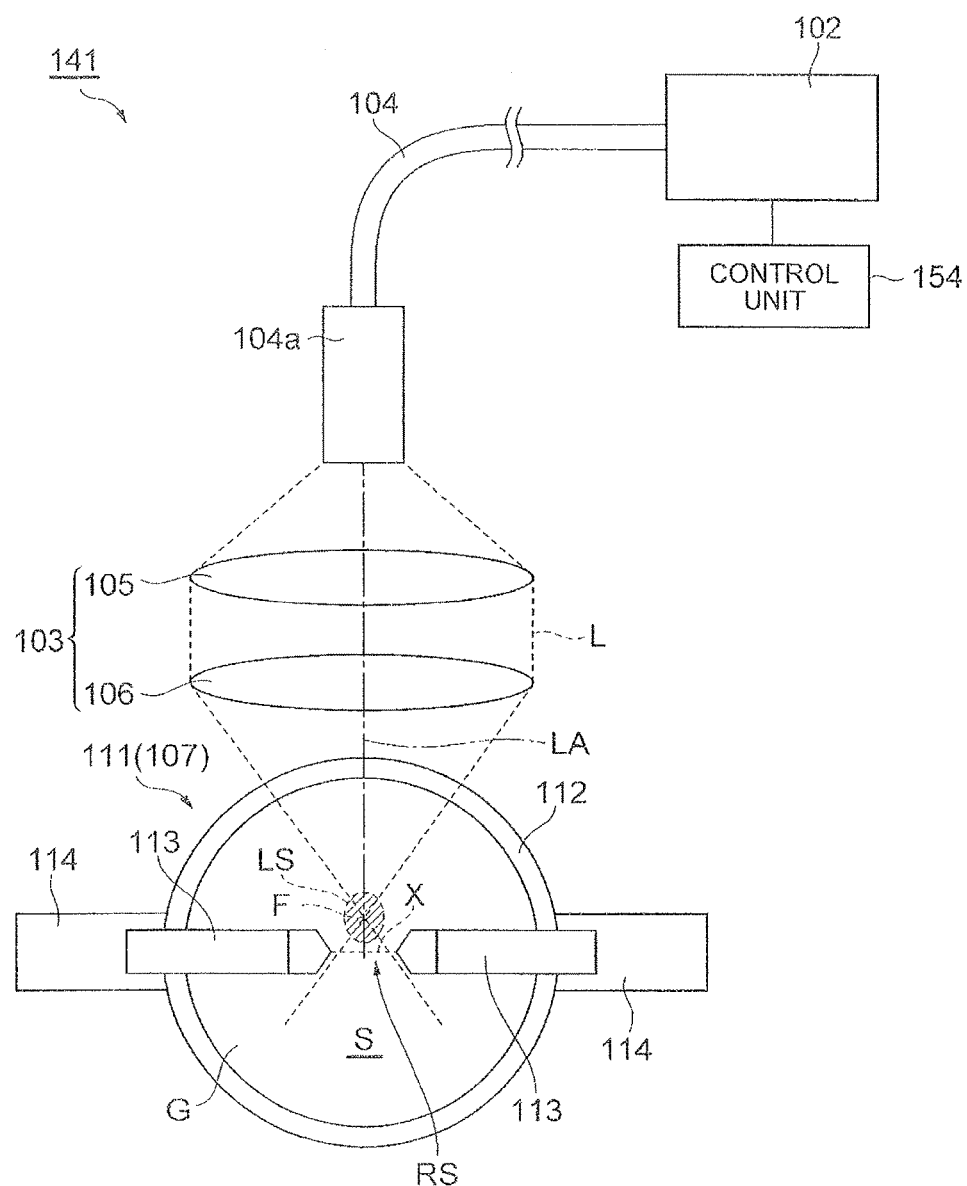
FIG. 32 is a diagram illustrating a light source device according to a tenth embodiment of the present invention.

FIG. 32 is a diagram illustrating a light source device according to a tenth embodiment of the present invention. Hereinafter, the light source device according to the tenth embodiment will be described. However, description overlapped to the description of the seventh to ninth embodiments is omitted. As illustrated in FIG. 32, a light source device 141 includes a control unit 154 that adjusts emission energy of a laser light L emitted from a laser unit 102. In addition, in the light source device 141, an optical system 103 condenses the laser light L at a position closer to a front side (upper side of FIG. 32) of a direction of an optical axis LA than a line X coupling pointed portions of counter electrodes 113 and 113.

Figure 33A:
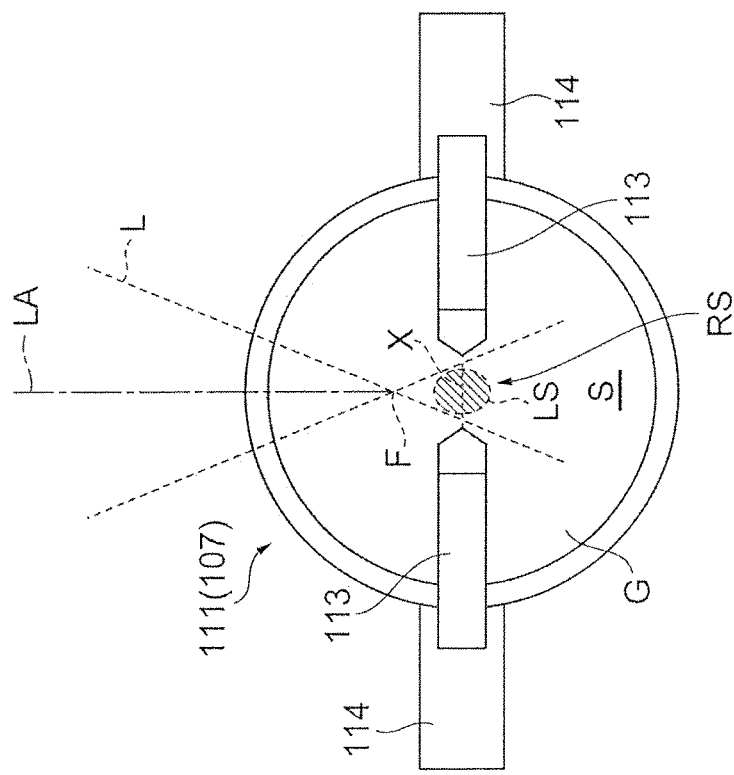
FIGS. 33A and 33B are diagrams illustrating functions of the light source device illustrated in FIG. 32 and, specifically.
Figure 33B:
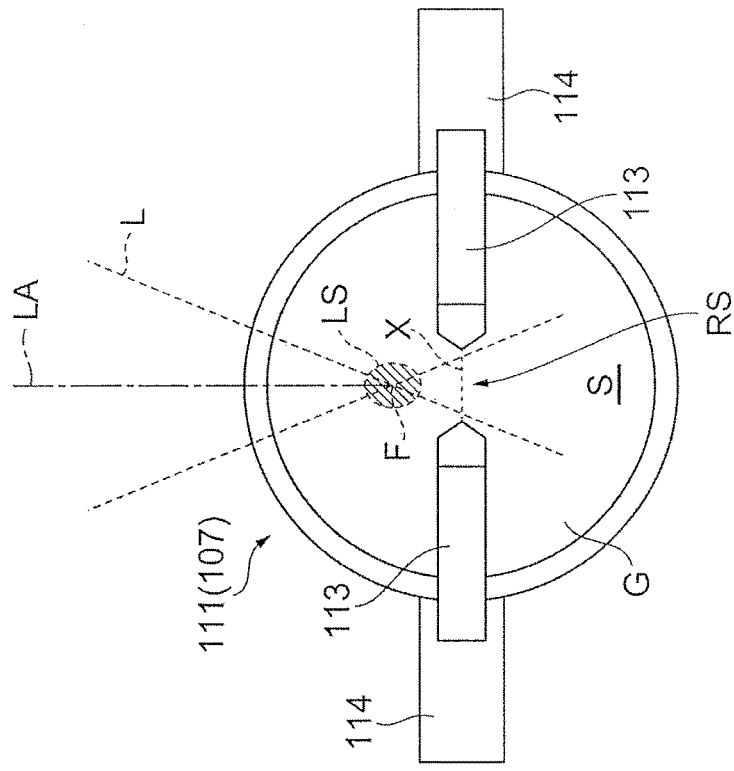

FIGS. 33A and 33B are diagrams illustrating functions of the control unit 154. As illustrated in FIG. 33A, first, the control unit 154 sets a condensing position F of the laser light L to a position separated from the counter electrodes 113 and 113 (lighting start region RS) and sets emission energy of the laser light L emitted from the laser unit 102, such that an energy density of the laser light L on the line X (lighting start region RS) coupling the pointed portions of the counter electrodes 113 and 113 be a degree (for example, about 260 kW/cm$^2$) where the laser support light LS can be put on. As a result, the laser light L on the line X (lighting start region RS) coupling the pointed portions of the counter electrodes 113 and 113 can light the laser support light LS in a defocused state.

Next, after the laser support light LS is put on (when the laser support light LS is maintained), as illustrated in FIG. 33B, the control unit 154 sets the emission energy of the laser light L emitted from the laser unit 102 to be lower than the emission energy of the laser light L when the laser support light LS is put on, in a state in which the condensing position F of the laser light L is maintained at a position (position of FIG. 33A) when the laser support light LS is put on. As a result, because a region having energy capable of maintaining the laser support light LS can be set to only the vicinity of the condensing position F of the laser light L, the laser support light LS can be maintained at the position separated from the counter electrodes 113 and 113 (lighting start region RS).

As such, in the light source device 141, the emission energy of the laser light L emitted from the laser unit 102 is adjusted by the control unit 154 while the laser light L is condensed at the position separated from the (lighting start region RS) between the counter electrodes 113 and 113 at all times. Thereby, the energy density of the laser light L on the line X (lighting start region RS) coupling the pointed portions of the counter electrodes 113 and 113 can be changed. Therefore, because the condensing position F of the laser light L having the highest energy density is not positioned in (the lighting start region RS) between the counter electrodes 113 and 113 at all times, sputtering of the counter electrodes 113 can be suppressed and a sufficiently long life of the light source device 141 can be realized. In addition, in the light source device 141, because it is not necessary to mechanically move the condensing position F of the laser light L, the condensing position of the laser light L can be maintained at an appropriate position and because a device to move the optical system 103 or the light emission sealing body 111 is not necessary, the light source device can be miniaturized.

In the tenth embodiment, the optical system 103 condenses the laser light L at the position closer to the front side (upper side of FIG. 32) of the direction of the optical axis LA than the line X (lighting start region RS) coupling the pointed portions of the counter electrodes 113 and 113. However, the optical system 103 may condense the laser light L at the position closer to the back side (lower side of FIG. 32) of the direction of the optical axis LA than the line X (lighting start region RS) coupling the pointed portions of the counter electrodes 113 and 113. Even in this case, similar to the tenth embodiment, the control unit 154 adjusts the emission energy of the laser light L emitted from the laser unit 102, so that sputtering of the counter electrodes 103 can be suppressed.

In the embodiments described above, the condensing position F (laser support light LS) moves in the direction of the optical axis LA of the laser light L. However, if the condensing position F of the laser light L after the laser support light LS is put on (when the laser support light LS is maintained) is positioned separate from the counter electrodes 113 (lighting start region RS) with respect to the condensing position F of the laser light L when the laser support light LS is put on, the condensing position F may move in a direction (for example, a direction intersecting with the optical axis LA of the laser light L) different from the direction of the optical axis LA of the laser light L.

REFERENCE SIGNS LIST 1, 21, 31, 41, 81, 101, 121, 131, 141 light source device; 2, 102 laser unit; 3, 103 optical system; 7, 107 light source; 8, 28, 108 optical member; 9, 29, 39, 49, 109 transparent medium; 11, 61, 71, 111 light emission sealing body; 13, 23 metal structure (electron emission structure); 14 coil; 18, 118 actuator; 25a inclined surface; 51, 151 optical path length adjustment unit; 52, 152 optical system movement unit; 53, 153 light emission sealing body movement unit; 54 electron emission structure movement unit; 55 control unit; 113 counter electrode; F condensing position; G light emission gas; L (continuous) laser light; LA optical axis; LS laser support light; RS lighting start region; S internal space.

The invention claimed is:

1. A light source device comprising:
a laser unit generating a laser light; and
a light source having a light emission sealing body with an internal space in which a light emitting gas is sealed and a metal structure is accommodated,
wherein a laser support light is put on by heating the metal structure and then irradiating the laser light having an energy density for putting on the laser support light onto the metal structure,
the laser support light is maintained by continuously irradiating the laser light onto the laser support light that has been put on, and
a condensing position of the laser light is moved so as to be positioned in a spatial region of the internal space of the light emission sealing body in which the laser support light is separated from the metal structure when maintaining the laser support light.

2. The light source device according to claim 1, wherein the metal structure is heated by irradiation of the laser light.

3. The light source device according to claim 1, wherein
the metal structure extends in a direction orthogonal to an optical axis of the laser light, and
the metal structure is heated by irradiation of the laser light from a direction of a side surface of the metal structure.

4. The light source device according to claim 1, wherein irradiation of the laser light onto the metal structure is performed in a defocused state.

5. The light source device according to claim 1, wherein the laser light is approximately irradiated onto a surface of the metal structure when putting on the laser support light.

6. The light source device according to claim 1, wherein the metal structure is accommodated only in the internal space and does not penetrate the light emission sealing body.

7. The light source device according to claim 1, further comprising:
an optical system guiding the laser light into the internal space,
wherein a condensing position of the laser light is moved by movement of the optical system.

8. The light source device according to claim 1, further comprising:
an optical system guiding the laser light into the internal space,
wherein a condensing position of the laser light is moved by adjustment of the optical system.

9. The light source device according to claim 1, wherein a condensing position of the laser light is moved by movement of the light emission sealing body.

10. The light source device according to claim 1, wherein a condensing position of the laser light is moved by movement of the metal structure.

11. A light source device comprising:
a laser unit generating a laser light; and
a light source having a light emission sealing body with an internal space in which a light emitting gas is sealed and a metal structure is accommodated,
wherein a laser support light is put on by heating the metal structure and then irradiating the laser light having an energy density for putting on the laser support light onto the metal structure,
the laser support light is maintained by continuously irradiating the laser light onto the laser support light that has been put on,
the metal structure has an electron emission unit containing an easily electron-emitting material and a support unit supporting the electron emission unit, and
the metal structure is heated by irradiating the laser light onto the support unit.

12. The light source device according to claim 11, wherein
the electron emission unit is supported at a leading end side of the support unit,
the support unit has a holding unit being larger in diameter than the electron emission unit, and
the laser light is irradiated onto the holding unit.

13. The light source device according to claim 12, wherein a reduced diameter portion is provided between a base end of the support unit and the holding unit, the reduced diameter portion having a reduced diameter so as to be narrower than the base end and the holding unit.

14. The light source device according to claim 11, wherein the electron emission unit has a columnar portion, and an inclined portion provided at a leading end of the columnar portion and being inclined to an axis of an extension direction of the columnar portion.

15. The light source device according to claim 11, wherein the metal structure is accommodated only in the internal space and does not penetrate the light emission sealing body.

16. The light source device according to claim 11, further comprising:
an optical system guiding the laser light into the internal space,
wherein a condensing position of the laser light is moved by movement of the optical system.

17. The light source device according to claim 11, further comprising:
an optical system guiding the laser light into the internal space,
wherein a condensing position of the laser light is moved by adjustment of the optical system.

18. The light source device according to claim 11, wherein a condensing position of the laser light is moved by movement of the light emission sealing body.

19. The light source device according to claim 11, wherein a condensing position of the laser light is moved by movement of the metal structure.

20. A light source device comprising:
a laser unit that emits a laser light; and
a light source that has a light emission sealing body of which an internal space is filled with light emission gas and into which the laser light enters from one side, and counter electrodes arranged inside the internal space so as to face each other,
wherein plasma generated in a discharge region between the counter electrodes is maintained as a laser support light by radiation of the laser light, and
wherein the laser light is condensed at a position separated from the counter electrodes on the one side, and the laser support light is maintained in a region separated from the counter electrodes.

21. The light source device according to claim 20, wherein
the counter electrodes include pointed portions,
the discharge region is positioned on a line coupling the pointed portions, and
the laser light enters the light emission sealing body at an optical axis intersecting with the line, and is condensed at a position on a front side of the line in the optical axis direction.

22. The light source device according to claim 20, wherein the laser light is also radiated to the discharge region, and the energy density of the laser light in the discharge region is lower than the energy density of the laser light in a maintaining region of the laser support light.

23. The light source device according to claim 20, wherein power for discharge between the counter electrodes is supplied when generating the plasma, and supplying of the power to the counter electrodes is stopped when maintaining the laser support light.

24. The light source device according to claim 20, wherein the laser light is condensed at a position separated from the discharge region in the one side after being condensed in the discharge region.

* * * * *